(12) United States Patent
Nishioka

(10) Patent No.: US 6,410,452 B2
(45) Date of Patent: Jun. 25, 2002

(54) METHOD OF MANUFACTURING SEMICONDUCTOR DEVICE

(75) Inventor: Naho Nishioka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/795,309

(22) Filed: Mar. 1, 2001

(30) Foreign Application Priority Data

Jul. 21, 2000 (JP) ........................................ 2000-220590

(51) Int. Cl.[7] .............................................. H01L 21/302
(52) U.S. Cl. ..................... 438/734; 438/725; 438/723; 438/724; 438/701; 438/702; 438/703; 438/719; 438/695
(58) Field of Search ................................ 438/717, 725, 438/702, 703, 713, 714, 719, 723, 724, 695, 701, 734

(56) References Cited

U.S. PATENT DOCUMENTS

| | | | | | |
|---|---|---|---|---|---|
| 5,807,789 A | * | 9/1998 | Chen et al. | ................... | 438/714 |
| 5,874,317 A | * | 2/1999 | Stolmeijer | .................... | 437/67 |
| 6,081,662 A | * | 6/2000 | Murakami et al. | ........... | 438/218 |
| 6,150,237 A | * | 11/2000 | Lee | .............................. | 438/433 |
| 6,232,203 B1 | * | 5/2001 | Huang | ........................... | 438/424 |
| 6,265,317 B1 | * | 7/2001 | Chin et al. | ................... | 438/711 |
| 2001/0036705 A1 | * | 11/2001 | Nishida et al. | .............. | 438/296 |

FOREIGN PATENT DOCUMENTS

| | | |
|---|---|---|
| JP | 2-174140 | 5/1990 |
| JP | 5-326357 | 10/1993 |
| JP | 9-321134 | 12/1997 |
| JP | 2000-21970 | 1/2000 |

* cited by examiner

Primary Examiner—George Goudreau
(74) Attorney, Agent, or Firm—McDermott, Will & Emery

(57) ABSTRACT

A method of manufacturing a semiconductor device having a trench isolation structure includes patterning a mask film on a semiconductor substrate, forming a trench by etching the semiconductor substrate by use of the mask film, filling the trench with an insulating film by repeating depositing the insulating film in the trench and etching the insulating film by sputter etching, removing the mask film, and removing the insulating film by etching a predetermined amount of the insulating film filled in the trench. According to the sputter etching in the step of filling the trench with the insulating film, an edge between a surface of the substrate and an inner wall surface of the trench forms an inclined surface to the surface of the substrate.

5 Claims, 39 Drawing Sheets

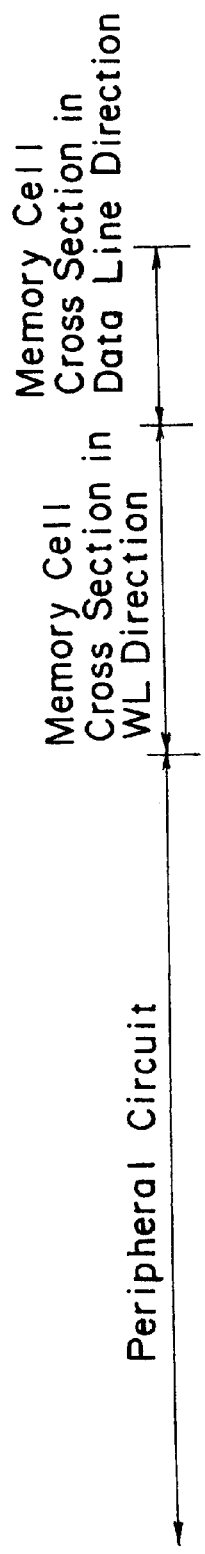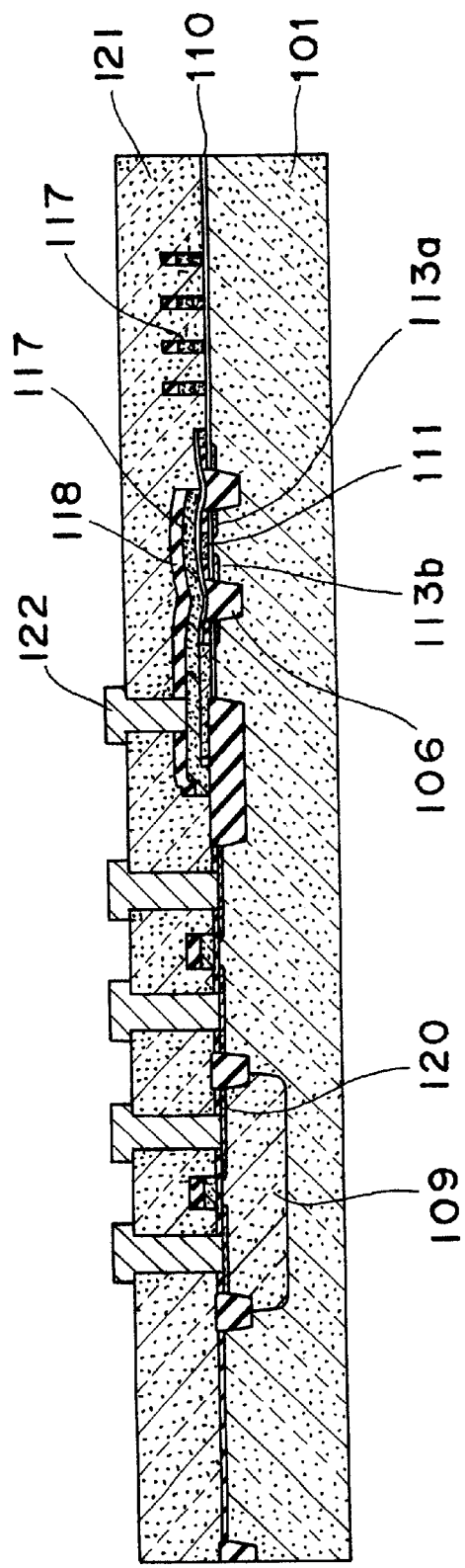
Fig. 1

METHOD OF MANUFACTURING SEMICONDUCTOR DEVICE

BACKGROUND OF THE INVENTION

1. Field of the Invention

The invention relates to a method of manufacturing a semiconductor device having a trench isolation structure and more particularly to a method of manufacturing a nonvolatile semiconductor memory having a trench isolation structure.

2. Description of the Related Art

To form a semiconductor device, a plurality of devices is formed on one semiconductor substrate so as to function as the semiconductor device. Formation of a plurality of devices on the same substrate requires electrical isolation of the devices from one another. LOCOS, a trench isolation structure or the like is generally used as a method of isolating devices. Of these methods, the trench isolation structure is used as the method of isolating devices for a micro-device, because the trench isolation structure does not have to form a thick thermal oxide film and is effective for microfabrication, as distinct from LOCOS. Semiconductor devices having the trench isolation structure are of various types. Semiconductor devices include a nonvolatile semiconductor memory having a floating gate, such as a DRAM, an SRAM, an EPROM or an EEPROM.

Semiconductor devices having a conventional trench isolation structure include a nonvolatile semiconductor memory comprising a memory cell and a peripheral circuit as shown in FIG. 24, for example. The memory cell and the peripheral circuit have the respective trench isolation structures, and edges of the trench isolation structures are angular as shown in a partially sectional view of FIG. 25. The nonvolatile semiconductor memory is manufactured in the following manner. First, a silicon oxide film 102 of 10 nm thick is grown on a main surface of a p type (001) silicon substrate 101 by use of thermal oxidation. Subsequently, a silicon nitride film 103 of 200 nm thick is deposited on the silicon oxide film 102 by reduced pressure CVD method. Next, a resist 104 is formed into a desired pattern by photolithography, and then the silicon nitride film 103 is etched by using the resist 104 as a mask (see FIG. 26).

Subsequently, the silicon oxide film 102 is etched by using the resist 104 as a mask, whereby trenches 105 each having a depth of about 400 nm are formed in the surface of the silicon substrate 101, and then the resist 104 is removed (see FIG. 27).

Furthermore, a silicon oxide film 106 of 600 nm thick is deposited by using CVD, whereby the trenches 105 are filled with the silicon oxide film 106 (see FIG. 28). Then, the surface of the silicon oxide film 106 is polished by chemical mechanical polishing (CMP), and a predetermined amount of the silicon oxide film is etched by using a hydrogen fluoride (HF) aqueous solution. Subsequently, the silicon nitride film 103 is removed by using heated phosphoric acid, and then the silicon oxide film 102 is removed by using the hydrogen fluoride aqueous solution as an etchant, whereby trench isolations 107 are formed (see FIG. 29).

Next, a resist 108 is formed into a desired pattern by photolithography. Then, by using the resist 108 as a mask, phosphorus ions of $2 \times 10^{13}$ cm$^{-2}$ are implanted with energy of 1.2 MeV in the silicon substrate 101, and subsequently phosphorus ions of $2 \times 10^{12}$ cm$^{-2}$ 2 are implanted with energy of 200 keV in the silicon substrate 101. After that, heat treatment takes place at a temperature of 1000° C. under a nitrogenous atmosphere, whereby an n well region 109 is formed (see FIG. 30).

Furthermore, a silicon oxide film 110 of 10 nm thick, which is to constitute a tunnel oxide film of a memory transistor, is grown by thermal oxidation. Then, phosphorus-doped polycrystalline silicon 111 of 100 nm thick and a silicon oxide film 112 of 100 nm thick are deposited on the silicon oxide film 110 by reduced pressure CVD method. After that, a resist is formed into a desired pattern by photolithography, and then the silicon oxide film 112 is etched by using the resist as a mask. After the resist is removed, the phosphorus-ions-doped polycrystalline silicon 111 is etched. Subsequently, ions of arsenic of $2 \times 10^{15}$ cm$^{-2}$ are implanted with energy of 40 keV by ion implantation. After that, heat treatment takes place at a temperature of 850° C. for 30 minutes under a nitrogenous atmosphere, whereby the ions of arsenic are activated and thus n type diffused layers 113a and 113b are formed (see FIG. 31).

Subsequently, a silicon oxide film 114 of 800 nm thick is deposited by reduced pressure CVD method, and heat treatment takes place at a temperature of 850° C. for 30 minutes under a nitrogenous atmosphere (see FIG. 32). Then, the silicon oxide film 114 is etched, whereby the surface of the phosphorus-ions-doped polycrystalline silicon 111 is exposed (see FIG. 33).

Subsequently, a three-layer insulating film 115 comprising a silicon oxide film of 5 nm thick, a silicon nitride film of 10 nm thick and a silicon oxide film of 5 nm thick is deposited by reduced pressure CVD method (see FIG. 34).

Next, the memory cell is coated with a resist by photolithography, and the three-layer insulating film 115, the phosphorus-ions-doped polycrystalline silicon 111 and the silicon oxide film 110 on the substrate surface, which are to constitute the peripheral circuit, are removed. After that, the resist is removed (see FIG. 35).

After that, a silicon oxide film 116 of 30 nm thick, which is to constitute a gate oxide film of a transistor of the peripheral circuit, is grown by use of thermal oxidation (see FIG. 36). In this case, in the memory cell, the silicon nitride film in the three-layer insulating film 115 prevents thermal oxidation of an underlayer.

Subsequently, phosphorus-ions-doped polycrystalline silicon 117 of 200 nm thick and a silicon oxide film 118 of 200 nm thick are deposited by reduced pressure CVD method. A resist is formed into a desired pattern by photolithography, then the silicon oxide film 118 is etched by using the resist as a mask, and then the resist is removed. After that, the phosphorus-ions-doped polycrystalline silicon 117, which is to constitute a gate electrode of the transistor of the peripheral circuit, is etched by using the silicon oxide film 118 as a mask. At the same time, the phosphorus-ions-doped polycrystalline silicon 117, which is to constitute a control gate of the memory transistor, is etched, and then the resist is removed (see FIG. 37).

A resist is formed on the peripheral circuit by photolithography, and then the three-layer insulating film 115 and the phosphorus-ions-doped polycrystalline silicon 111 are etched by using the silicon oxide film 118 of the memory cell as a mask, whereby a floating gate electrode 111 of the memory transistor is formed.

Next, a resist is formed into a desired pattern by photolithography, then ions of arsenic of $3 \times 10^{15}$ cm$^{-2}$ are implanted with energy of 50 keV by using the resist as a mask, and then the resist is removed. A resist is again formed into a desired pattern by photolithography, and then ions of $BF_2$ of $3 \times 10^{15}$ cm$^{-2}$ are implanted with energy of 30 keV by using the resist as a mask. After that, heat treatment takes place at a temperature of 800° C. for 30 minutes under a nitrogenous atmosphere, whereby an n type diffused layer 119 of an n-channel transistor of the peripheral circuit and a p type diffused layer 120 of a p-channel transistor thereof are formed (see FIG. 38).

Furthermore, boron phosphorus glass 121 of 1 μm (1000 nm) thick is deposited by CVD. After that, heat treatment takes place at a temperature of 850° C. for 30 minutes under a nitrogenous atmosphere, whereby the boron phosphorus glass 121 is thermally shrunk. Subsequently, a resist is formed into a desired pattern by photolithography, and then the boron phosphorus glass 121 is etched by using the resist as a mask, whereby a contact hole is opened. After that, an aluminum-silicon-copper (Al—Si—Cu) alloy film 122 is deposited by sputtering. Next, a resist is formed into a desired pattern by photolithography, and then the aluminum-silicon-copper (Al—Si—Cu) alloy film 122 is etched by using the resist as a mask, whereby aluminum-silicon-copper (Al—Si—Cu) wiring 122 is formed (see FIG. 39). The semiconductor device having the trench isolation structure can be obtained through the above-described steps and processes.

A memory function of the nonvolatile semiconductor memory having the floating gate will be described below with reference to FIG. 40 showing an enlarged sectional view of the memory cell shown in FIG. 24. The nonvolatile semiconductor memory stores information (data) in the memory cell in accordance with whether electrons are injected into the floating gate or ejected from the floating gate. In a status in which electrons are injected into the floating gate 111, a threshold voltage of the memory cell takes on a given high value Vthp. This status is called a program status. In this case, data "1" is stored in the memory cell. Since the electrons stored in the floating gate 111 are not semipermanently erased in the program status, the stored data is also semipermanently held. In a status in which electrons are ejected from the floating gate 111, the threshold voltage of the memory cell takes on a given low value Vthe. This status is called an erase status. In this case, data "0" is stored in the memory cell. The data stored in the memory cell can be read by detecting whether the memory cell is in the program status or the erase status.

At the program time, a high voltage Vpp (generally about 20 V) is applied to the control gate 117, whereby the n type diffused layers 113a and 113b and the substrate 101 are grounded. Thus, electrons are generated in a channel formed in a region between the n type diffused layers 113a and 113b, an energy barrier formed by the tunnel insulating film 110 is tunneled, and thus the electrons are allowed to enter into the floating gate 111. As a result, the threshold voltage of the memory cell rises.

At the erase time, the high voltage Vpp (generally −20 V) is applied to the control gate 117, whereby the n type diffused layers 113a and 113b and the silicon substrate 101 are grounded. Thus, a tunnel phenomenon allows electrons to exit from the floating gate 111 to the silicon substrate 101. As a result, the threshold voltage of the memory cell drops.

At the time of a read operation of a selected memory transistor, for example, a voltage of 3.3 V (Vcg=3.3 V) and a voltage of 3.3 V are applied to the control gate 117 and a drain (the n type diffused layer 113a), respectively, whereby a source (the n type diffused layer 113b) and the silicon substrate 101 are grounded. When Vthp>3.3 (V)>Vthe, a current does not pass between the source and the drain of the memory transistor in the program status, whereas a current passes between the source and the drain of the memory transistor in the erase status.

At the time of the above-mentioned read operation, in any memory transistor other than the selected memory transistor, the control gate 117 is grounded (Vcg=0 V), and a voltage of 3.3 V is applied to the drain (the n type diffused layer 113a), whereby the source (the n type diffused layer 113b) and the silicon substrate 101 are grounded. When Vthp>Vthe>0 (V), a current does not pass between the source and the drain of the memory transistor regardless of the program status or the erase status because Vcg=0 V.

Therefore, whether each memory cell is in the program status or the erase status can be detected in accordance with whether or not a current passes between the source and the drain of the selected memory transistor.

However, it is known that the semiconductor device having the conventional trench isolation structure has the following disadvantage. That is, the shape of the edge of the trench isolation structure is "angular" as shown in FIG. 25, thus the edge is intensively subjected to a stress and an electric field, and this causes deterioration in insulating properties and reliability of insulating films of a memory cell transistor and a peripheral transistor. Thus, the following problems arise. For example, in the memory cell, a phenomenon occurs in which electrons stored in the floating gate are prone to exit from the floating gate. In the peripheral transistor, a transistor capable of withstanding a high voltage required for write and erase cannot be formed, and an oxide film cannot have a sufficiently long life under the load of high voltage.

Therefore, various attempts to control the shape of the trench edge have been heretofore made in order to prevent the trench edge from intensively incurring a stress and an electric field. For example, one attempt is a method which includes forming a mask on a semiconductor substrate; forming an opening for forming a trench in the mask layer; then performing isotropic etching to a shallow depth through the opening; and subsequently performing anisotropic etching to a predetermined depth, thereby forming a trench for isolating devices (see Japanese Laid-open Patent Publication No. 2-174140). The trench having the opening in the upper portion thereof is formed by the above-mentioned method. However, it is relatively difficult to adjust setting of conditions for isotropic etching, or the like.

Another attempt is as follows. Methods of forming a connect hole such as a contact hole for connecting metal wiring include a method which includes changing a sectional shape of a resist pattern from a cylindrical shape into a tapered shape; and tapering an overall insulating film by etching (see Japanese Laid-open Patent Publication No. 5-326357). However, the method causes etching to taper the overall connect hole, and moreover the method requires a complicated process such as two steps of exposure.

Still another attempt is a method of manufacturing a semiconductor which includes forming a trench through a semiconductor oxide layer and a semiconductor main surface by dry etching; and successively rounding an upper edge of the trench by wet etching (see Japanese Laid-open Patent Publication No. 2000-21970). The rounded upper edge of the trench prevents the edge from intensively incurring an electric field.

However, a procedure is prone to be complicated because wet etching takes place in succession to dry etching.

A further attempt is a method of manufacturing a semiconductor device which includes thermally oxidizing an inner wall of a trench and thereby controlling a distance between facing corners of an upper edge of the trench (see Japanese Laid-open Patent Publication No. 9-321134). The method allows preventing the trench isolation edge from intensively incurring an electric field.

However, a process is prone to be complicated because the method requires a step of thermally oxidizing the inner wall of the trench. Moreover, the control of thermal oxidation or the like involves difficulties.

SUMMARY OF THE INVENTION

It is therefore an object of the invention to provide a method of manufacturing a semiconductor device which can obtain a semiconductor device having a trench isolation for preventing a trench edge of a trench isolation structure from intensively incurring an electric field and a stress, by means of a simple process such as dry etching without the use of a complicated process such as wet etching or thermal oxidation.

In accordance with one aspect of the present invention, there is provided a method of manufacturing a semiconductor device having a trench isolation structure. The method of manufacturing a semiconductor device having a trench isolation structure includes:

patterning a mask film on a semiconductor substrate;
forming a trench by etching the semiconductor substrate by use of the mask film;
filling the trench with an insulating film by repeating depositing the insulating film in the trench and etching the insulating film by sputter etching;
removing the mask film; and
removing the insulating film by etching a predetermined amount of the insulating film filled in the trench.

According to the sputter etching in filling the trench with the insulating film, an edge between a surface of the substrate and an inner wall surface of the trench forms an inclined surface to the surface of the substrate.

The shape of the trench edge will be more specifically described. The edge between the inner wall surface of the trench and the surface of the semiconductor substrate may comprise one or more inclined surface to the surface of the semiconductor substrate. Therefore, the edge may have a polyhedral shape such as a so-called chamfered shape. Moreover, the edge may include one or more concave or convex surface. Therefore, the edge may partly include a curved surface portion of the concave or convex surface.

The sputter etching may include controlling a flow rate of a flowing deposition gas.

The mask film may include a silicon oxide film and a silicon nitride film formed on the silicon oxide film.

In other aspect of the present invention a method of manufacturing a semiconductor device having a trench isolation structure includes:

depositing a silicon oxide film and a silicon nitride film in sequence on a semiconductor substrate;
patterning a resist film on the silicon nitride film; forward tapering the silicon nitride film and the silicon oxide film;
forming a trench by etching the semiconductor substrate by using the silicon nitride film as a mask;
filling the trench with an insulating film;
removing the silicon nitride film; and
removing the insulating film by etching a predetermined amount of the insulating film filled in the trench.

The step of forming the trench may include etching the forward-tapered silicon oxide film and the semiconductor substrate in sequence.

Thus, an edge between a surface of the semiconductor substrate and an inner wall surface of the trench forms an inclined surface to the surface of the semiconductor substrate.

Before forming the trench, the silicon oxide film and the silicon nitride film are stacked in sequence on the semiconductor substrate as shown in FIG. 22. An etched surface exposed by anisotropic etching in a depth direction is slightly inclined to a vertical surface. On the etched surface, the silicon oxide film whose top surface is not coated with the silicon nitride film is exposed and faced to diagonally upward direction. The etched surface is called a forward-tapered surface because the etched surface has an exposed surface diagonally upward. In this case, the respective etched surfaces of the silicon nitride film and the silicon oxide film do not necessarily require the same inclination.

The step of forward tapering the silicon nitride film and the silicon oxide film may include etching using the resist film as a mask, while controlling a flow rate of a deposition gas flowing through the silicon nitride film and the silicon oxide film.

The insulating film filling in the trench may be a silicon oxide film.

The semiconductor device having the trench isolation structure may be a nonvolatile semiconductor memory.

As described in detail above, according to the method of manufacturing the semiconductor device according to the invention, an edge between an inner wall surface of a trench and a surface of a semiconductor substrate can form an inclined surface to the surface of the semiconductor substrate. Therefore, the obtained semiconductor device can prevent the trench edge from intensively incurring a stress and an electric field and can thus improve properties of the device and reliability of an oxide film.

Moreover, according to the method of manufacturing a semiconductor device according to the invention, sputter etching includes controlling a flow rate of a flowing deposition gas. Therefore, the shape of the trench edge can be appropriately controlled.

Furthermore, according to the method of manufacturing a semiconductor device according to the invention, a multi-layered film comprising a silicon oxide film and a silicon nitride film formed on the silicon oxide film is used as a mask film. Therefore, the multilayered film can also function as the mask film, while protecting the silicon oxide film.

According to the method of manufacturing a semiconductor device according to the invention, the edge between the inner wall surface of the trench and the surface of the semiconductor substrate can form the inclined surface to the surface of the semiconductor substrate. Therefore, the obtained semiconductor device can prevent the trench edge from intensively incurring a stress and an electric field and can thus improve properties of the device and reliability of an oxide film.

Moreover, according to the method of manufacturing a semiconductor device according to the invention, a flow rate of a flowing deposition gas is controlled. Therefore, the silicon nitride film and the silicon oxide film can be appropriately forward tapered.

Furthermore, according to the method of manufacturing a semiconductor device according to the invention, the insulating film filled in the trench is a silicon oxide film. Therefore, the insulating film can have good insulating properties.

Furthermore, according to a method of manufacturing a nonvolatile semiconductor memory according to the invention, in the memory cell of the obtained nonvolatile semiconductor memory, electrons stored in the floating gate can be held with stability. In the peripheral transistor, a transistor capable of withstanding a high voltage for write and erase can be formed, and moreover an oxide film can have a life long enough to treat a high voltage.

BRIEF DESCRIPTION OF THE DRAWINGS

FIG. 1 is a sectional view of a semiconductor device which is obtained by a method of manufacturing a semiconductor device according to a first preferred embodiment;

DETAILED DESCRIPTION OF THE PREFERRED EMBODIMENTS

Preferred embodiments will be described below with reference to the accompanying drawings in order to facilitate the understanding of the invention.

First Preferred Embodiment

Figure 2:
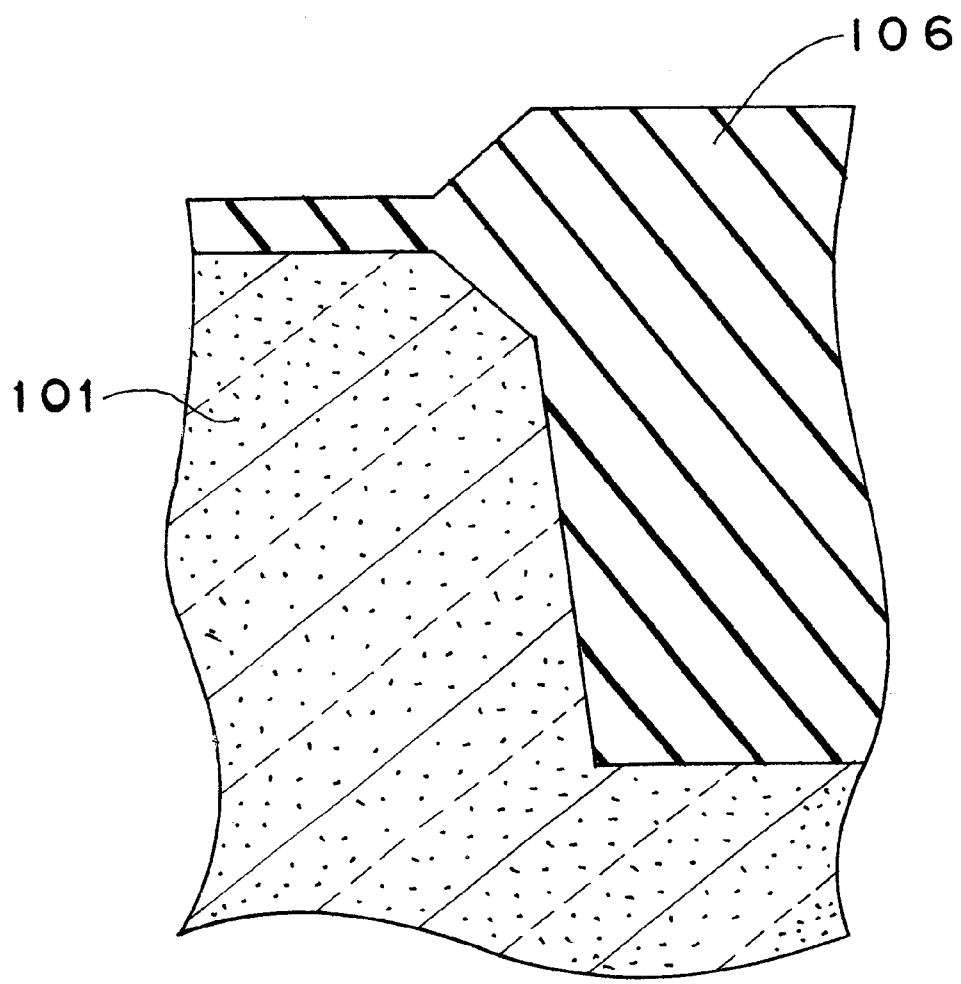
FIG. 2 is an enlarged sectional view of an edge of a trench isolation structure of the semiconductor device shown in FIG. 1.

FIG. 1 shows a semiconductor device which is obtained by a method of manufacturing a semiconductor device according to a first preferred embodiment. The semiconductor device is a nonvolatile semiconductor memory having a memory cell and a peripheral circuit as shown in FIG. 1. FIG. 2 shows an enlarged sectional view of an edge between an inner wall surface of a trench 105 filled with an insulating film 106 and a surface of a semiconductor substrate 101 of the semiconductor memory. As shown in FIG. 2, an edge 200 between the inner wall surface of the trench 105 and the surface of the semiconductor substrate 101 forms an inclined surface to the surface of the semiconductor substrate 101. Thus, it is possible to prevent a trench edge from intensively incurring a stress and an electric field. Therefore, it is possible to prevent deterioration in properties of the device and reliability of an oxide film.

Figure 3:
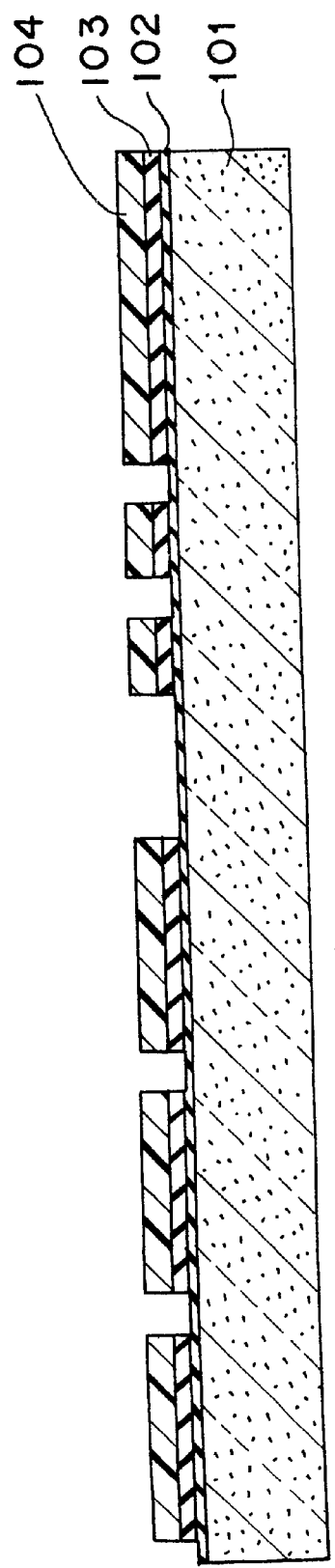
FIG. 3 is a sectional view for illustrating the method of manufacturing a semiconductor device according to the first preferred embodiment, in which a silicon nitride film is etched by using a patterned resist film.

Next, the method of manufacturing the semiconductor device will be described. First, a silicon oxide film 102 of 10 nm thick is grown on a main surface of the p type (001) silicon substrate 101 by use of thermal oxidation. Subsequently, a silicon nitride film 103 of 200 nm thick is deposited on the silicon oxide film 102 by reduced pressure CVD method. Then, a resist 104 is formed into a desired pattern by photolithography, and then the silicon nitride film 103 is etched by using the resist 104 as a mask (see FIG. 3).

Figure 4:
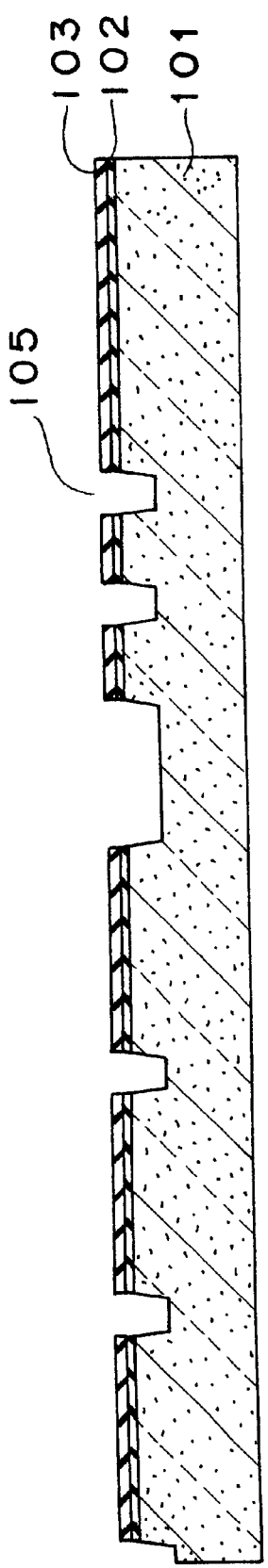
FIG. 4 is a sectional view for illustrating the method of manufacturing a semiconductor device according to the first preferred embodiment, in which a trench is formed and then the resist film is removed.

Subsequently, the silicon oxide film 102 and the silicon substrate 101 are etched by using the resist 104 as a mask, whereby the trenches 105 each having a depth of about 400 nm are formed in the surface of the silicon substrate 101, and then the resist 104 is removed (see FIG. 4).

Figure 5:
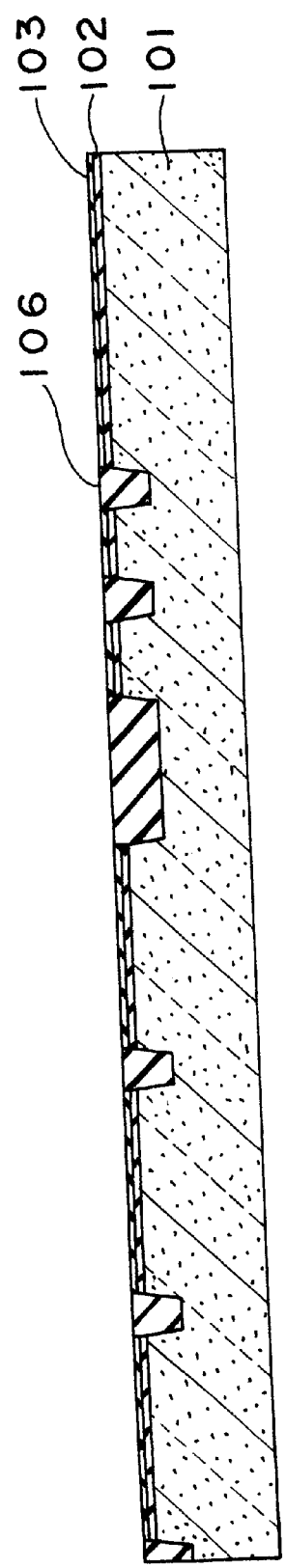
FIG. 5 is a sectional view for illustrating the method of manufacturing a semiconductor device according to the first preferred embodiment, in which the trench is filled with an insulating film.
Figure 17:
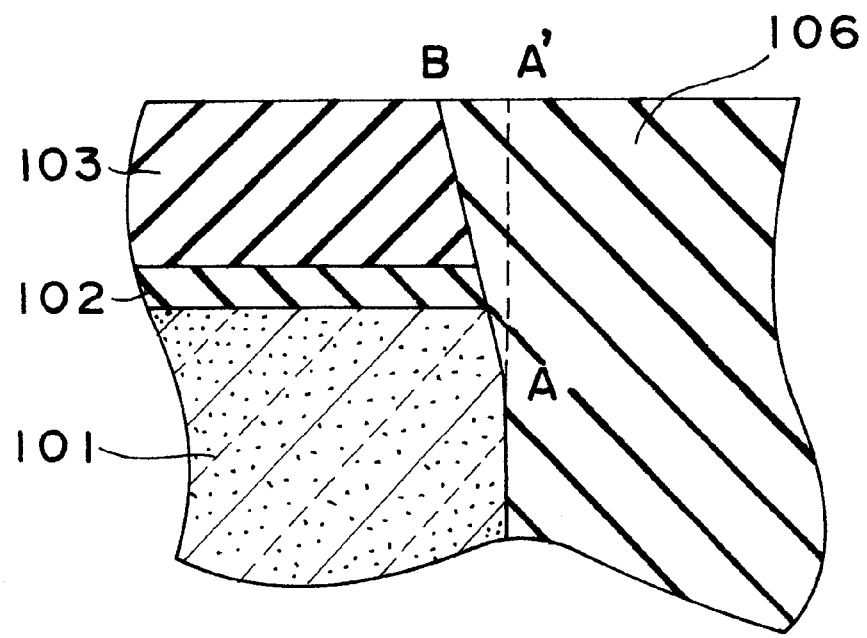
FIG. 17 is an enlarged sectional view of the edge of the trench filled with the silicon oxide film shown in FIG. 5.

Furthermore, a thick silicon oxide film 106 of 600 nm in thickness is deposited by using HDP (high-density plasma)-CVD, whereby the trenches 105 are filled with the silicon oxide film 106. At this time, a step of sputter etching and a step of depositing the silicon oxide film 106 by HDP-CVD are alternately repeated in order to increase the density of the silicon oxide film 106, whereby the trenches 105 are filled with the silicon oxide film 106 (see FIG. 5). At this time, a sputter component is controlled by controlling a flow rate of a flowing deposition gas, i.e., a silane gas. In the step of sputter etching, not only the silicon oxide film 102 and the silicon nitride film 103 but also a part of the silicon substrate 101 constituting the edges of the trenches 105 is etched. Thus, the inner wall surface of the trench being formed can be formed so as to make the angular edge shown by the line A–A' obtuse as shown by the line A–B, as shown in FIG. 17 showing an enlarged sectional view of the edge of a trench isolation structure shown in FIG. 5. Consequently, the edge between the inner wall surface of the trench 105 filled with the silicon oxide film 106 and the surface of the silicon substrate 101 can form the inclined surface to the surface of the silicon substrate 101.

Figure 6:
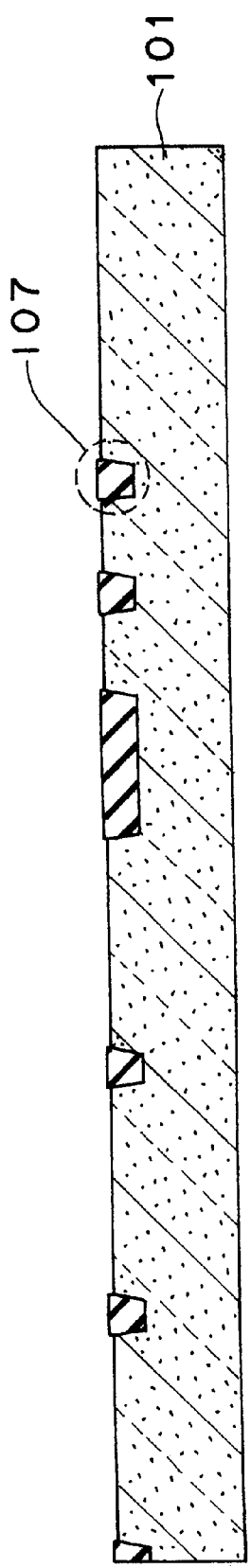
FIG. 6 is a sectional view for illustrating the method of manufacturing a semiconductor device according to the first preferred embodiment, in which the trench is exposed by removing the silicon nitride film and a silicon oxide film by means of chemical mechanical polishing.

Then, the surface of the thick silicon oxide film 106 is polished by chemical mechanical polishing (CMP), and a predetermined amount of the silicon oxide film 106 is etched by using a hydrogen fluoride (HF) aqueous solution. Subsequently, the silicon nitride film 103 is removed by using thermal phosphoric acid, and then the silicon oxide film 102 is removed by the hydrogen fluoride aqueous solution, whereby trench isolations 107 are formed (see FIG. 6).

Figure 7:
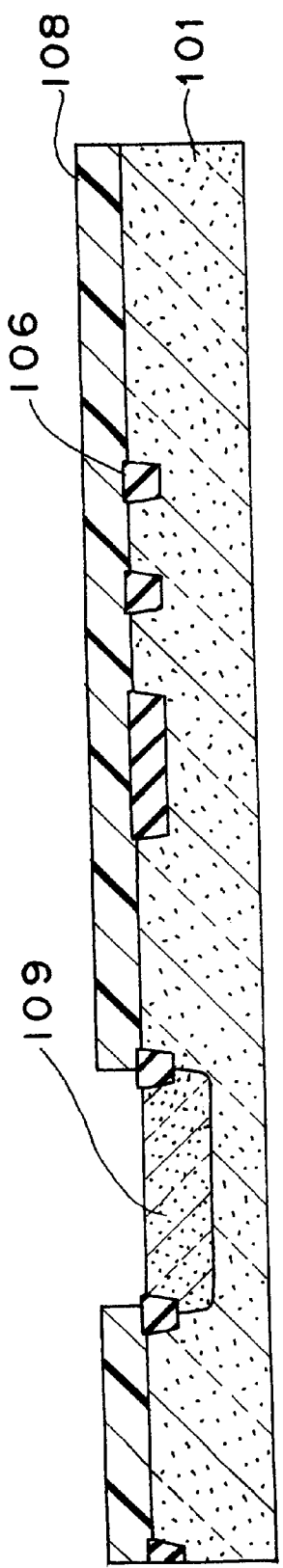
FIG. 7 is a sectional view for illustrating the method of manufacturing a semiconductor device according to the first preferred embodiment, in which an n well region is formed by forming a resist into a predetermined pattern and then implanting phosphorus ions into a predetermined region.

Next, a resist 108 is formed into a desired pattern by photolithography. Then, by using the resist 108 as a mask, phosphorus ions of $2\times10^{13}$ cm$^{-2}$ are implanted with energy of 1.2 MeV, and subsequently phosphorus ions of $2\times10^{12}$ cm$^{-2}$ are implanted with energy of 200 keV. After that, heat treatment takes place at a temperature of 1000° C. under a nitrogenous atmosphere, whereby an n well region 109 is formed (see FIG. 7).

Figure 8:
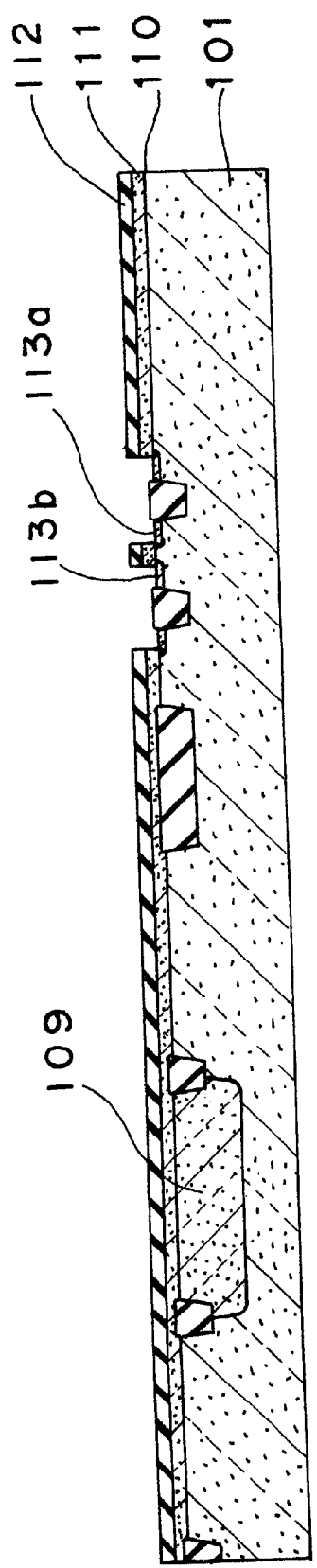
FIG. 8 is a sectional view for illustrating the method of manufacturing a semiconductor device according to the first preferred embodiment, in which n type diffused layers are formed in a predetermined region.

Furthermore, a silicon oxide film 110 of 10 nm thick, which is to constitute a tunnel oxide film of a memory transistor, is grown by thermal oxidation. Then, phosphorus-ions-doped polycrystalline silicon 111 of 100 nm thick and a silicon oxide film 112 of 100 nm thick are deposited on the silicon oxide film 110 by reduced pressure CVD method. After that, a resist is formed into a desired pattern by photolithography, and then the silicon oxide film 112 is etched by using the resist as a mask. After the resist is removed, the phosphorus-ions-doped polycrystalline silicon 111 is etched. Subsequently, ions of arsenic of $2\times10^{15}$ cm$^{-2}$ are implanted with energy of 40 keV by ion implantation. After that, heat treatment takes place at a temperature of 850° C. for 30 minutes under a nitrogenous atmosphere, whereby the ions of arsenic are activated and thus n type diffused layers 113a and 113b are formed (see FIG. 8).

Figure 9:
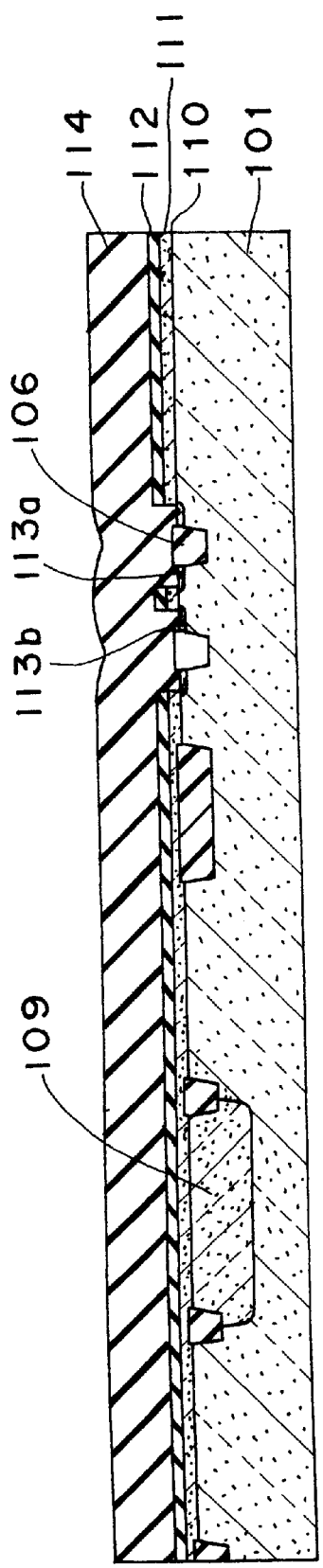
FIG. 9 is a sectional view for illustrating the method of manufacturing a semiconductor device according to the first preferred embodiment, in which a silicon oxide film is deposited and then heat treatment takes place under a nitrogenous atmosphere.
Figure 10:
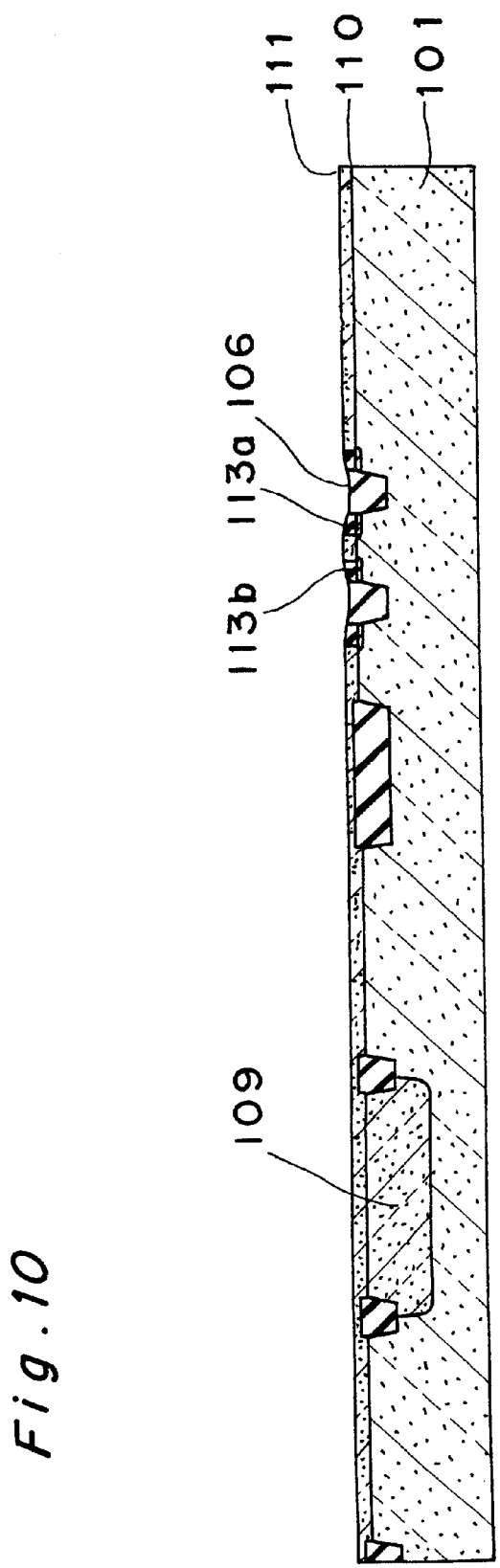
FIG. 10 is a sectional view for illustrating the method of manufacturing a semiconductor device according to the first preferred embodiment, in which a surface of phosphorus-ions-doped polycrystalline silicon is exposed.

Subsequently, a silicon oxide film 114 of 800 nm thick is deposited by reduced pressure CVD method, and heat treatment takes place at a temperature of 850° C. for 30 minutes under a nitrogenous atmosphere (see FIG. 9). Then, the silicon oxide film 114 is etched, whereby the surface of the phosphorus-ions-doped polycrystalline silicon 111 is exposed (see FIG. 10).

Figure 11:
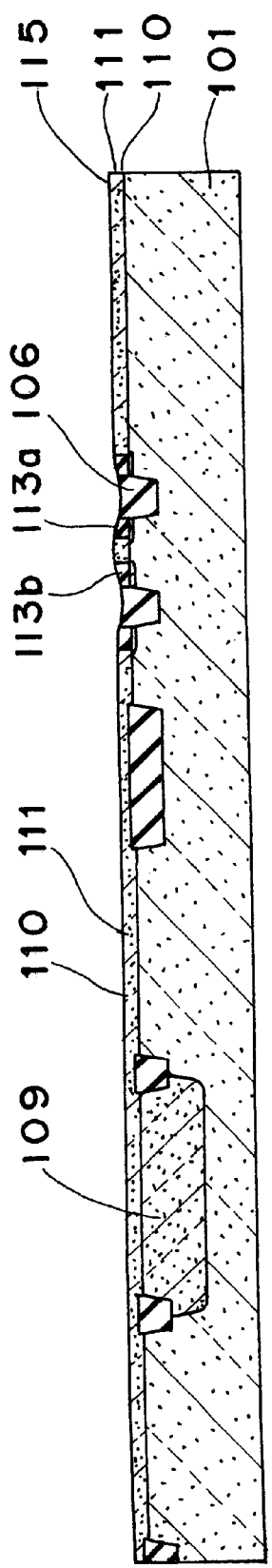
FIG. 11 is a sectional view for illustrating the method of manufacturing a semiconductor device according to the first preferred embodiment, in which a three-layer insulating film is deposited.

Subsequently, a three-layer insulating film 115 comprising a silicon oxide film of 5 nm thick, a silicon nitride film of 10 nm thick and a silicon oxide film of 5 nm thick is deposited by reduced pressure CVD method (see FIG. 11).

Figure 12:
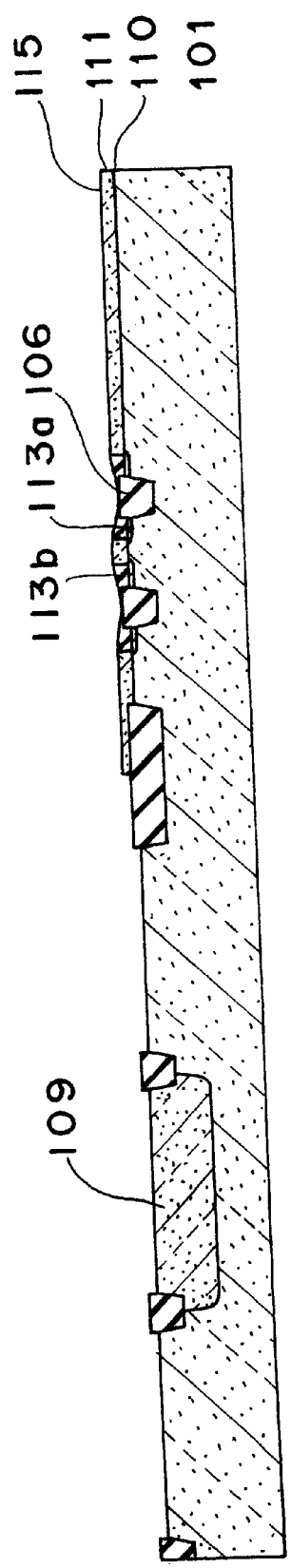
FIG. 12 is a sectional view for illustrating the method of manufacturing a semiconductor device according to the first preferred embodiment, in which the three-layer insulating film, the phosphorus-ions-doped polycrystalline silicon and the silicon oxide film are partly removed.

Next, the memory cell is coated with a resist by photolithography, and the three-layer insulating film 115, the phosphorus-ions-doped polycrystalline silicon 111 and the silicon oxide film 110 on the substrate surface, which are to constitute the peripheral circuit, are removed. After that, the resist is removed (see FIG. 12).

Figure 13:
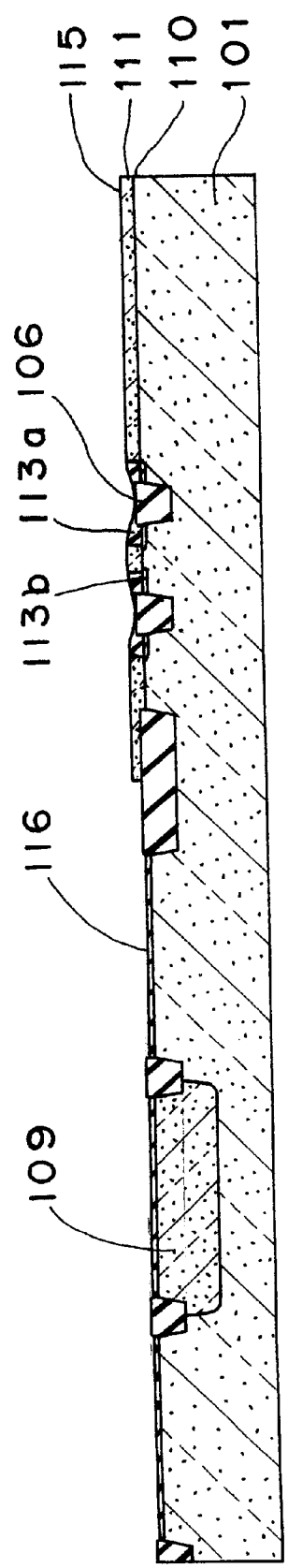
FIG. 13 is a sectional view for illustrating the method of manufacturing a semiconductor device according to the first preferred embodiment, in which a gate oxide film is grown by thermal oxidation.

After that, a silicon oxide film 116 of 30 nm thick, which is to constitute a gate oxide film of a transistor of the peripheral circuit, is grown by use of thermal oxidation (see FIG. 13). In this case, in the memory cell, the silicon nitride film in the three-layer insulating film 115 prevents thermal oxidation of an underlayer.

Figure 14:
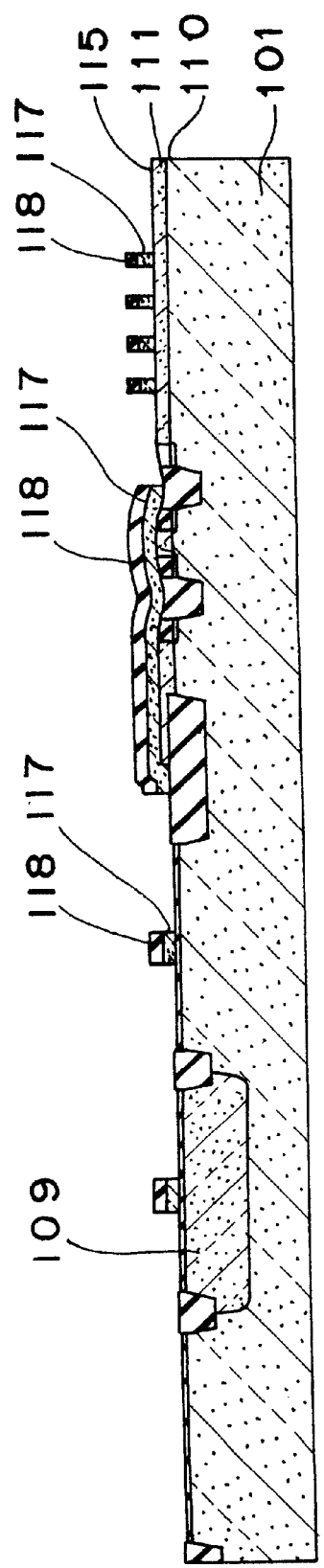
FIG. 14 is a sectional view for illustrating the method of manufacturing a semiconductor device according to the first preferred embodiment, in which phosphorus-ions-doped polycrystalline silicon and a silicon oxide film are formed in sequence and then patterned.

Subsequently, phosphorus-ions-doped polycrystalline silicon 117 of 200 nm thick and a silicon oxide film 118 of 200 nm thick are deposited by reduced pressure CVD method. A resist is formed into a desired pattern by photolithography, then the silicon oxide film 118 is etched by using the resist as a mask, and then the resist is removed. After that, the phosphorus-ions-doped polycrystalline silicon 117, which is to constitute a gate electrode of the transistor of the peripheral circuit, is etched by using the silicon oxide film 118 as a mask. At the same time, the phosphorus-ions-doped polycrystalline silicon 117, which is to constitute a control gate of the memory transistor, is etched, and then the resist is removed (see FIG. 14).

A resist is formed on the peripheral circuit by photolithography, and then the three-layer insulating film 115 and the phosphorus-ions-doped polycrystalline silicon 111 are etched by using the silicon oxide film 118 of the memory cell as a mask, whereby a floating gate electrode 111 of the memory transistor is formed.

Figure 15:
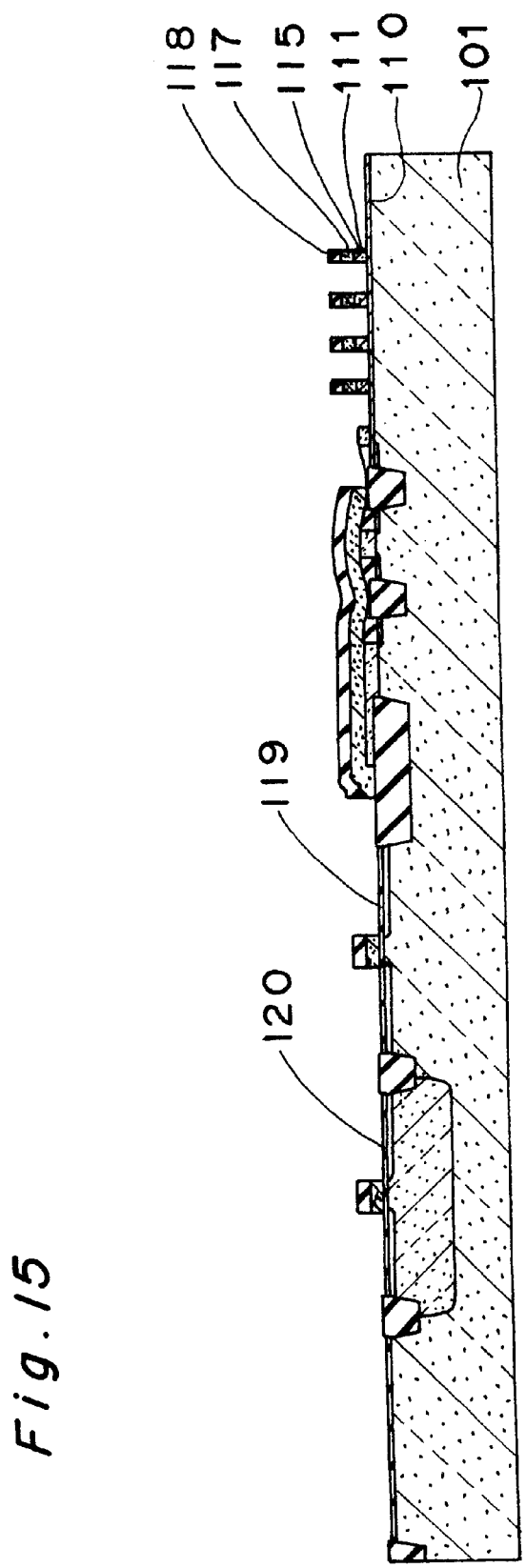
FIG. 15 is a sectional view for illustrating the method of manufacturing a semiconductor device according to the first preferred embodiment, in which a floating gate electrode of a memory transistor is formed and then an n type diffused layer and a p type diffused layer of a peripheral circuit are formed.

Next, a resist is formed into a desired pattern by photolithography, then ions of arsenic of $3 \times 10^{15}$ cm$^{-2}$ are implanted with energy of 50 keV by using the resist as a mask, and then the resist is removed. A resist is again formed into a desired pattern by photolithography, and then ions of $BF_2$ of $3 \times 10^{15}$ cm$^{-2}$ are implanted with energy of 30 keV by using the resist as a mask. After that, heat treatment takes place at a temperature of 800° C. for 30 minutes under a nitrogenous atmosphere, whereby an n type diffused layer 119 of an n-channel transistor of the peripheral circuit and a p type diffused layer 120 of a p-channel transistor thereof are formed (see FIG. 15).

Figure 16:
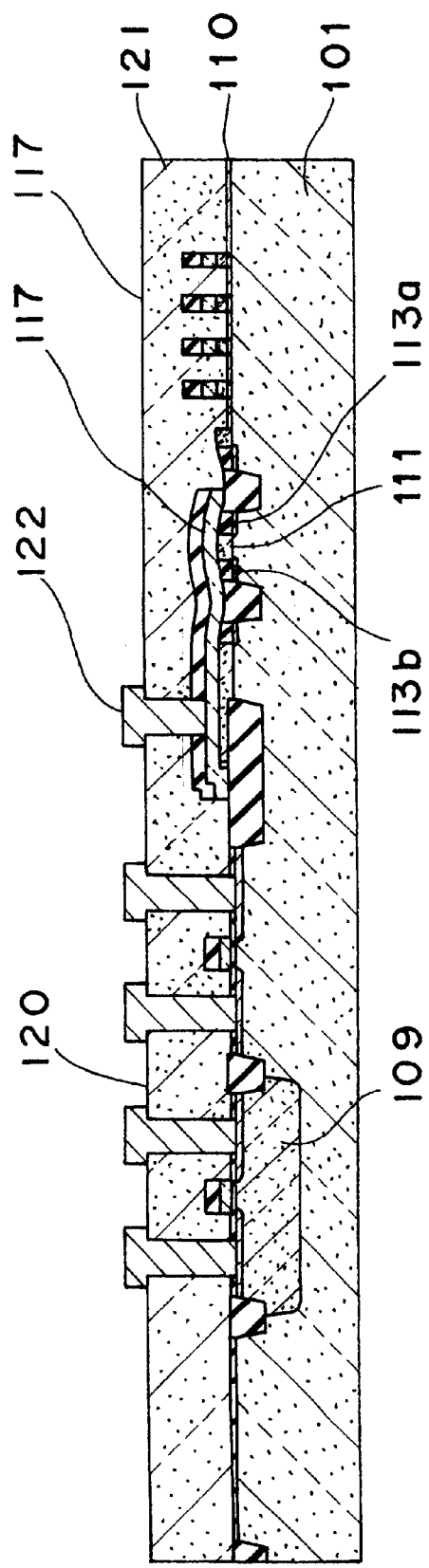
FIG. 16 is a sectional view for illustrating the method of manufacturing a semiconductor device according to the first preferred embodiment, in which boron phosphorus glass is deposited, and then an aluminum-silicon-copper alloy film is deposited by sputtering so that wiring is formed.

Furthermore, boron phosphorus glass 121 of 1 μm (1000 nm) thick is deposited by using CVD. After that, heat treatment takes place at a temperature of 850° C. for 30 minutes under a nitrogenous atmosphere, whereby the boron phosphorus glass 121 is thermally shrunk. Subsequently, a resist is formed into a desired pattern by photolithography, and then the boron phosphorus glass 121 is etched by using the resist as a mask, whereby a contact hole is opened. After that, an aluminum-silicon-copper (Al—Si—Cu) alloy film 122 is deposited by sputtering. Next, a resist is formed into a desired pattern by photolithography, and then the aluminum-silicon-copper (Al—Si—Cu) alloy film 122 is etched by using the resist as a mask, whereby aluminum-silicon-copper (Al—Si—Cu) wiring 122 is formed (see FIG. 16). Thus, the nonvolatile semiconductor memory having the trench isolation structure can be obtained.

In the semiconductor memory having the trench isolation structure, the edge between the inner wall surface of a device isolating portion, i.e., the trench 105 filled with the silicon oxide film 106 and the surface of the semiconductor substrate 101 forms the inclined surface to the surface of the semiconductor substrate. The shape of the trench edge will be more specifically described. The edge between the inner wall surface of the trench and the surface of the semiconductor substrate may comprise one or more inclined surface to the surface of the semiconductor substrate 101. Moreover, the edge may include one or more concave or convex surface.

In the semiconductor device obtained by the method of manufacturing a semiconductor device according to the first preferred embodiment, the edge between the inner wall surface of the trench and the surface of the semiconductor substrate 101 can form the inclined surface to the surface of the semiconductor substrate. Therefore, in the memory cell, electrons stored in the floating gate can be held with stability. In the peripheral transistor, a transistor capable of withstanding a high voltage for write and erase can be formed, and moreover an oxide film can have a life long enough to treat a high voltage.

Second Preferred Embodiment

Figure 18:
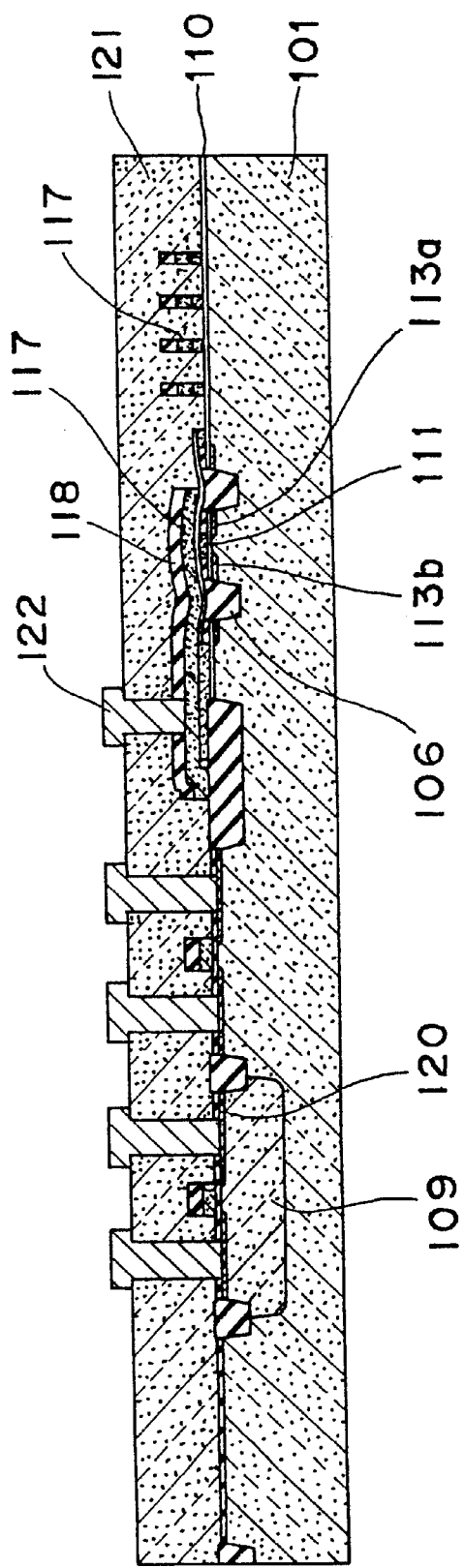
FIG. 18 is a sectional view of a semiconductor device which is obtained by a method of manufacturing a semiconductor device according to a second preferred embodiment.
Figure 19:
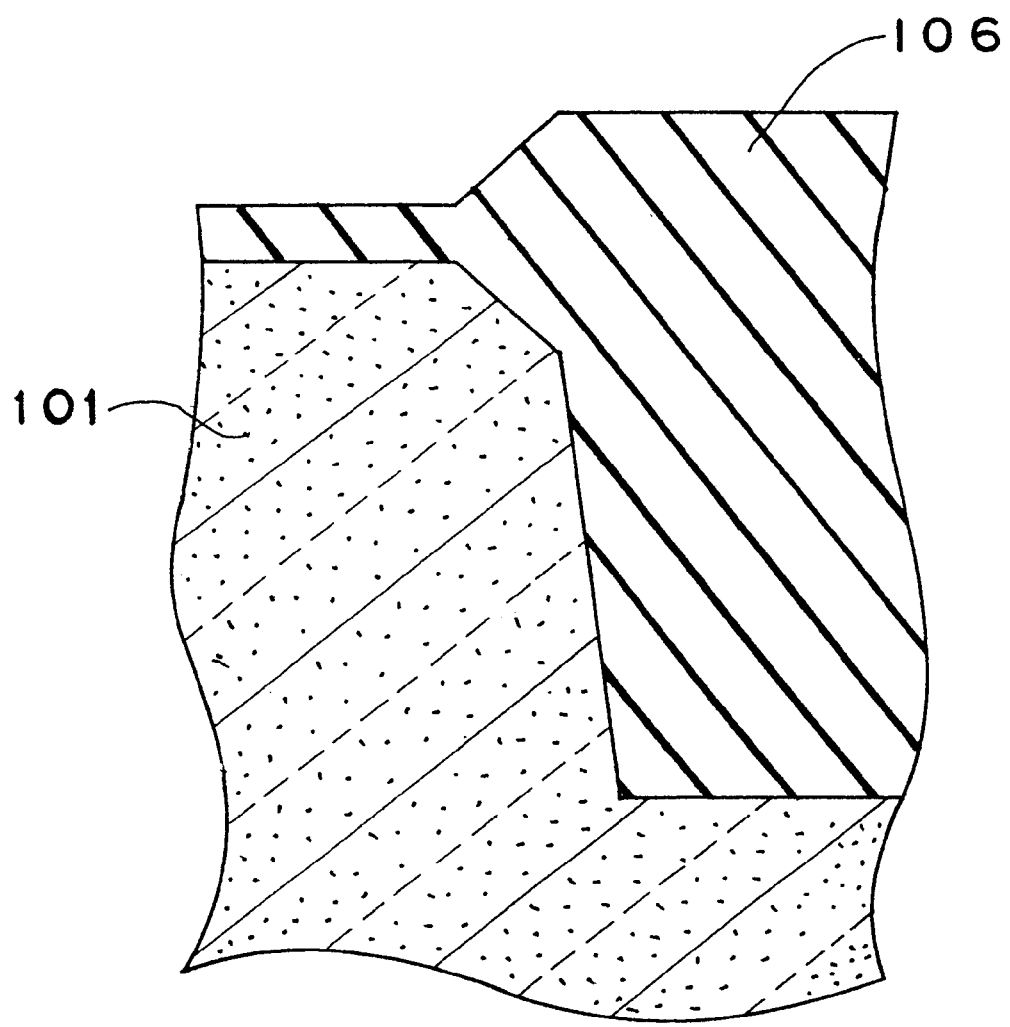
FIG. 19 is an enlarged sectional view of an edge of a trench isolation structure of the semiconductor device shown in FIG. 18.

FIG. 18 shows a semiconductor device which is obtained by a method of manufacturing a semiconductor device according to a second preferred embodiment. The semiconductor device is a nonvolatile semiconductor memory having a memory cell and a peripheral circuit as shown in FIG. 18. FIG. 19 shows an enlarged sectional view of the edge between the inner wall surface of the trench 105 filled with the insulating film 106 and the surface of the semiconductor substrate 101 of the semiconductor memory. As shown in FIG. 19, the edge between the inner wall surface of the trench and the surface of the semiconductor substrate 101 forms the inclined surface to the surface of the semiconductor substrate 101. Thus, it is possible to prevent the trench edge from intensively incurring a stress and an electric field. Therefore, it is possible to prevent deterioration in properties of the device and reliability of an oxide film.

The method of manufacturing a semiconductor device according to the second preferred embodiment differs from the method of manufacturing a semiconductor device according to the first preferred embodiment, in that the method according to the second preferred embodiment includes the step of forward tapering the silicon nitride film 103 and the silicon oxide film before forming the trench, while the step of filling the trench with the insulating film does not require fine adjustments of a deposition gas for setting conditions for sputter etching.

Figure 20:
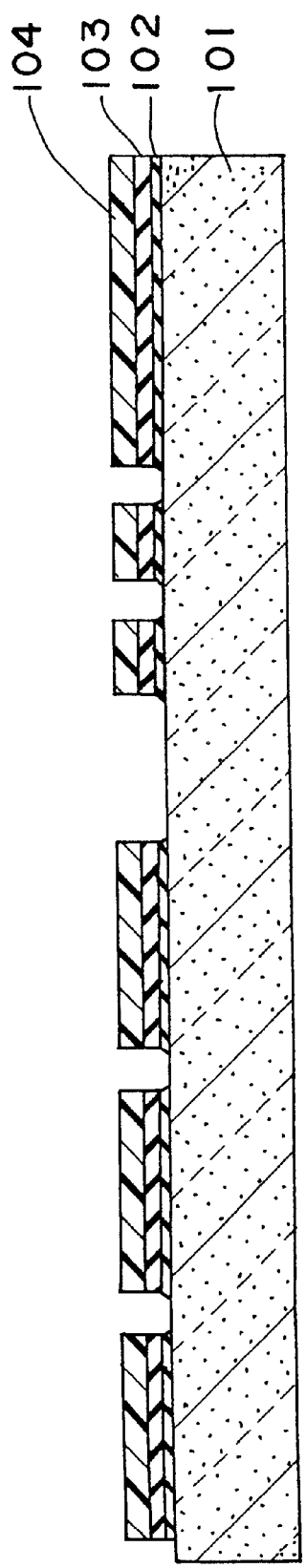
FIG. 20 is a sectional view for illustrating the method of manufacturing a semiconductor device according to the second preferred embodiment, in which a silicon nitride film is etched by using a patterned resist film.
Figure 22:
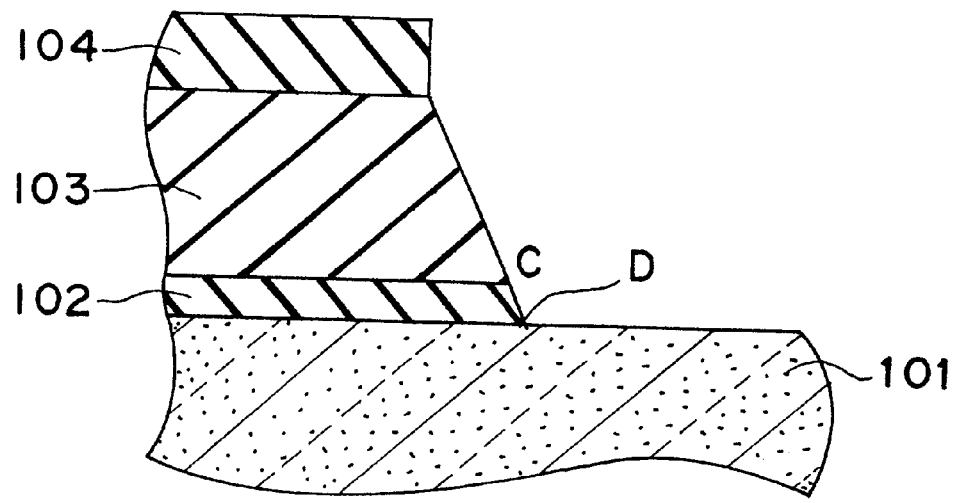
FIG. 22 is an enlarged sectional view of the forward-tapered silicon nitride film and silicon oxide film shown in FIG. 20.

Next, the method of manufacturing a semiconductor device according to the second preferred embodiment will be described. First, the silicon oxide film 102 of 10 nm thick is grown on the main surface of the p type (001) silicon substrate 101 by use of thermal oxidation. Subsequently, the silicon nitride film 103 of 200 nm thick is deposited on the silicon oxide film 102 by reduced pressure CVD method. Then, the resist 104 is formed into a desired pattern by photolithography, and then the silicon nitride film 103 and the silicon oxide film 102 are etched by using the resist 104 as a mask (see FIG. 20). At the time of etching, conditions for intensive sidewall deposition are selected by controlling a flow rate of a deposition gas, i.e., a fluorocarbon gas such as trifluoromethyl ($CHF_3$). Sidewall deposition is intensified, whereby etching takes place more intensively in a depth direction. Therefore, the silicon nitride film 103 and the silicon oxide film 102 can be forward tapered as shown in a partially enlarged view of FIG. 22.

Figure 21:
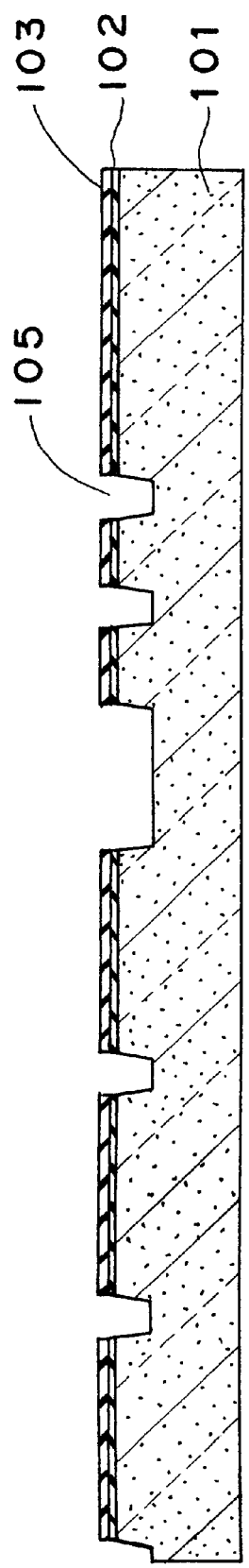
FIG. 21 is a sectional view for illustrating the method of manufacturing a semiconductor device according to the second preferred embodiment, in which a trench is formed and then the resist film is removed.
Figure 23:
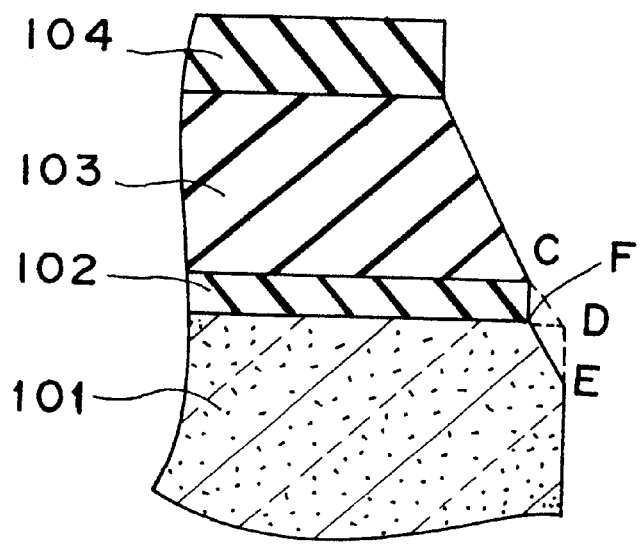
FIG. 23 is an enlarged sectional view of a trench edge after forming the trench shown in FIG. 21.
Figure 24:
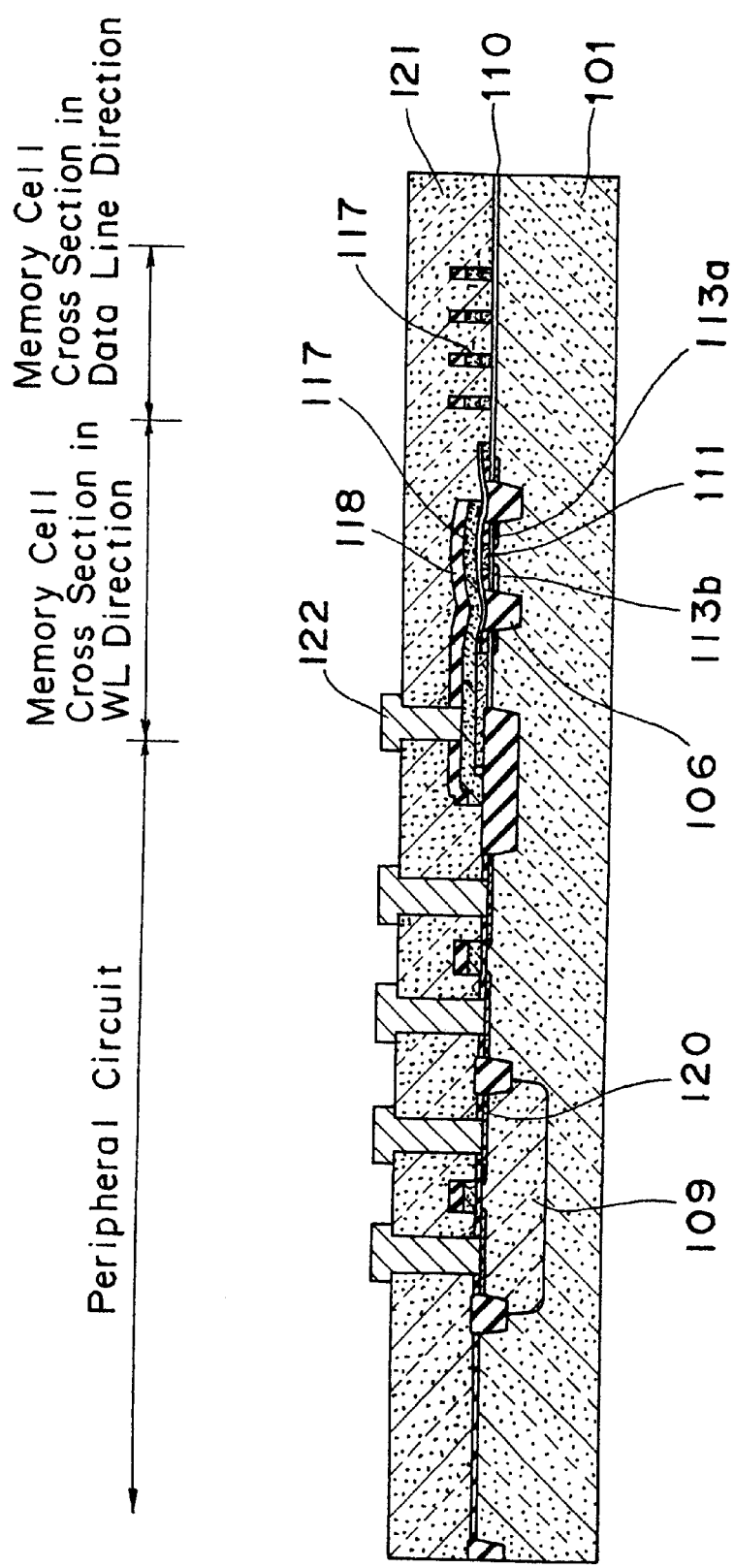
FIG. 24 is a sectional view of a semiconductor device which is obtained by a conventional method of manufacturing a semiconductor device.
Figure 25:
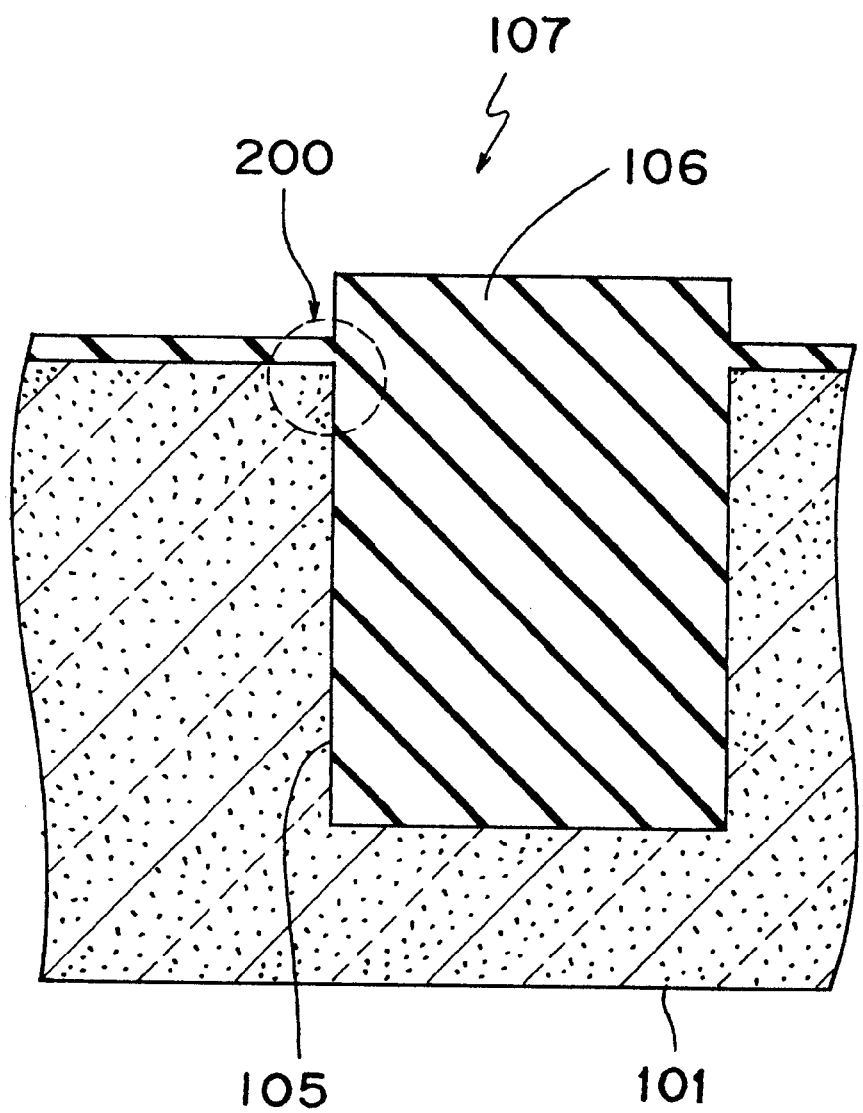
FIG. 25 is an enlarged sectional view of an edge of a trench isolation structure of the semiconductor device shown in FIG. 24.
Figure 26:
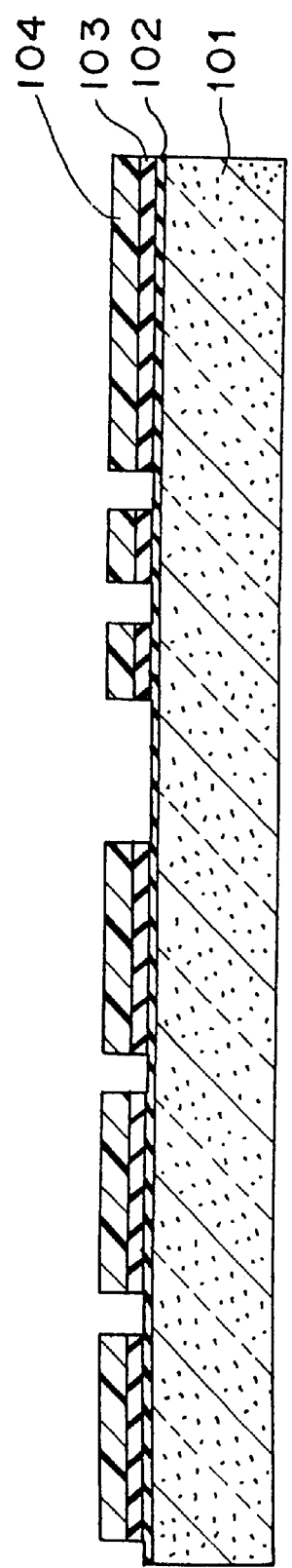
FIG. 26 is a sectional view for illustrating the conventional method of manufacturing a semiconductor device, in which a silicon nitride film is etched by using a patterned resist film.
Figure 27:
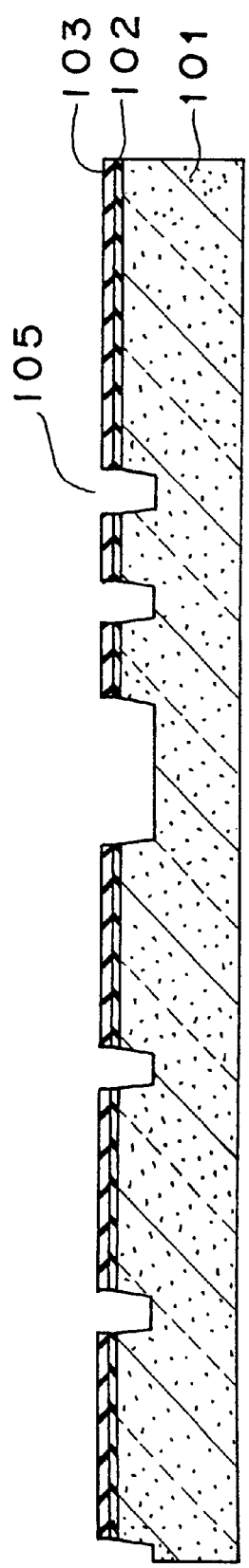
FIG. 27 is a sectional view for illustrating the conventional method of manufacturing a semiconductor device, in which a trench is formed and then the resist film is removed.
Figure 28:
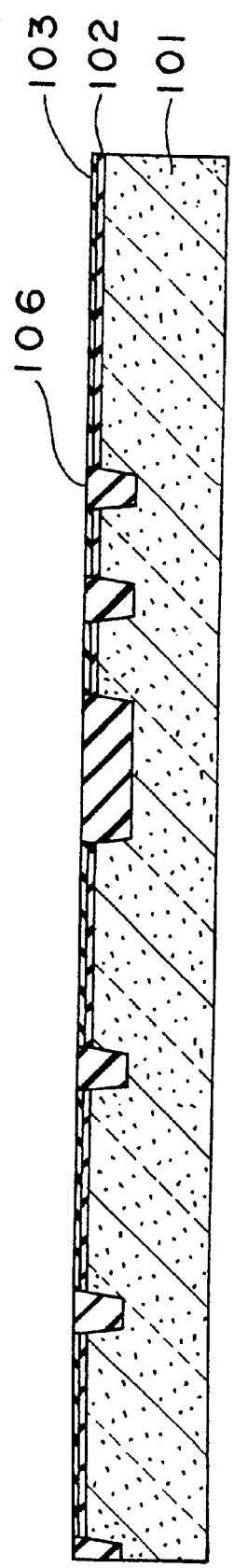
FIG. 28 is a sectional view for illustrating the conventional method of manufacturing a semiconductor device, in which the trench is filled with an insulating film.
Figure 29:
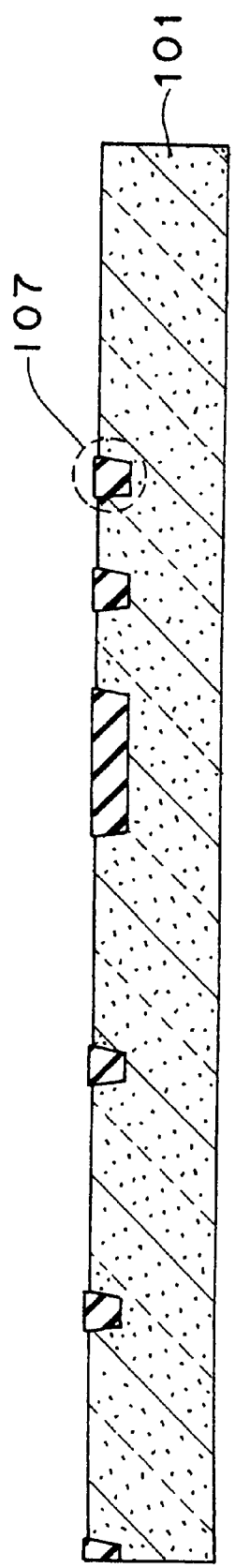
FIG. 29 is a sectional view for illustrating the conventional method of manufacturing a semiconductor device, in which the trench is exposed by removing the silicon nitride film and a silicon oxide film by means of chemical mechanical polishing.
Figure 30:
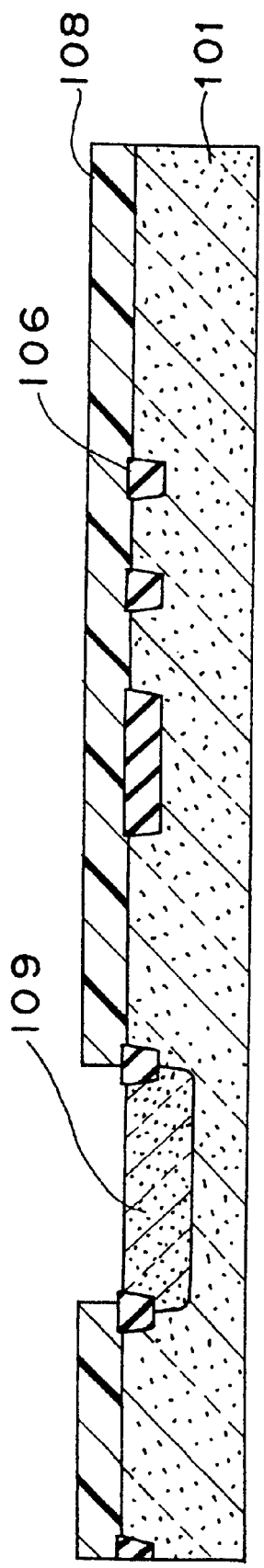
FIG. 30 is a sectional view for illustrating the conventional method of manufacturing a semiconductor device, in which an n well region is formed by forming a resist into a predetermined pattern and then implanting phosphorus ions into a predetermined region.
Figure 31:
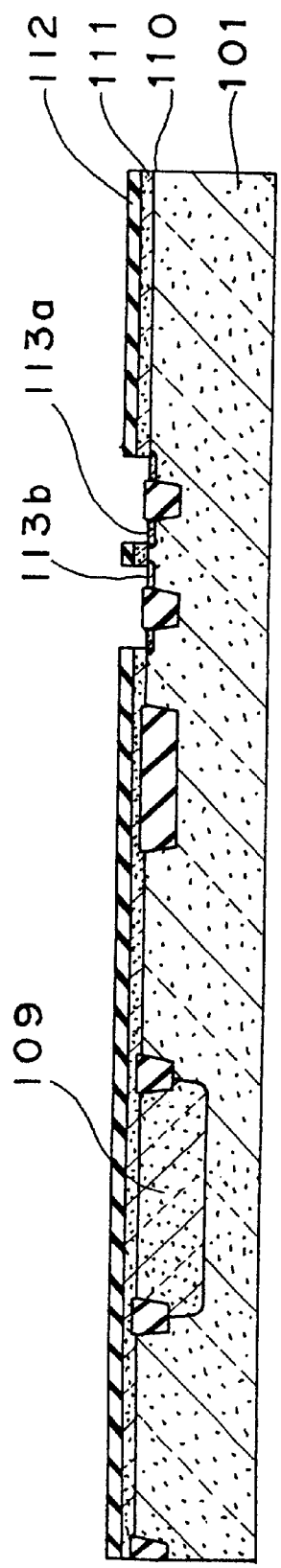
FIG. 31 is a sectional view for illustrating the conventional method of manufacturing a semiconductor device, in which n type diffused layers are formed in a predetermined region.
Figure 32:
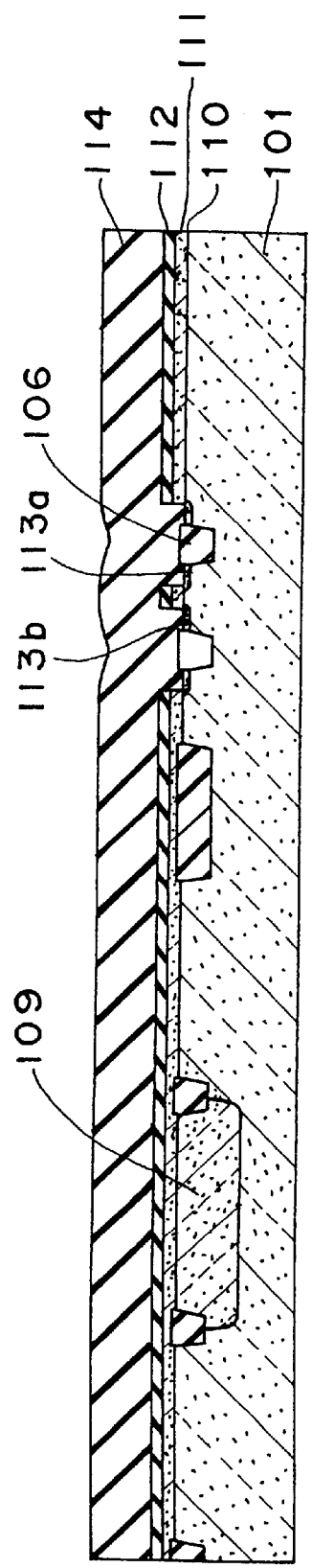
FIG. 32 is a sectional view for illustrating the conventional method of manufacturing a semiconductor device, in which a silicon oxide film is deposited and then heat treatment takes place under a nitrogenous atmosphere.
Figure 33:
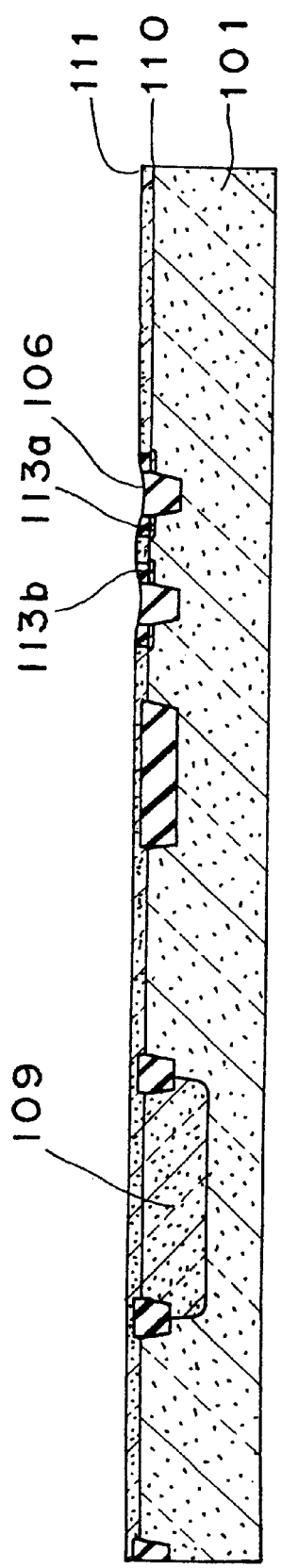
FIG. 33 is a sectional view for illustrating the conventional method of manufacturing a semiconductor device, in which a surface of phosphorus-ions-doped polycrystalline silicon is exposed.
Figure 34:
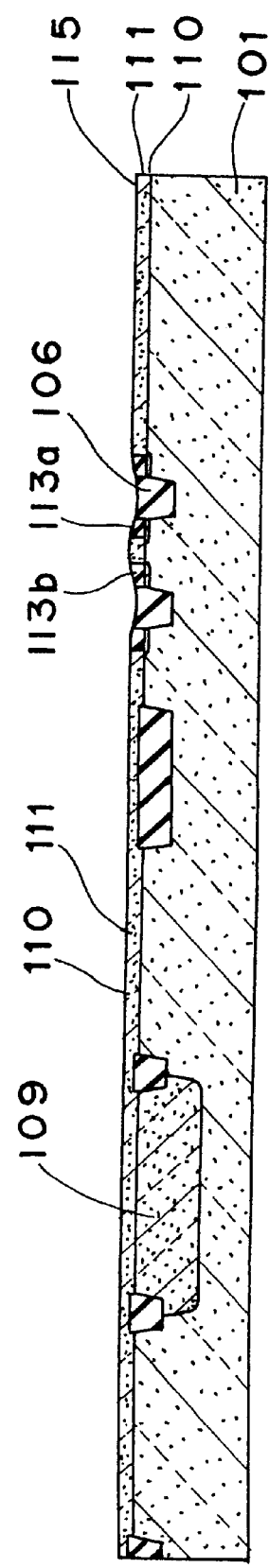
FIG. 34 is a sectional view for illustrating the conventional method of manufacturing a semiconductor device, in which a three-layer insulating film is deposited.
Figure 35:
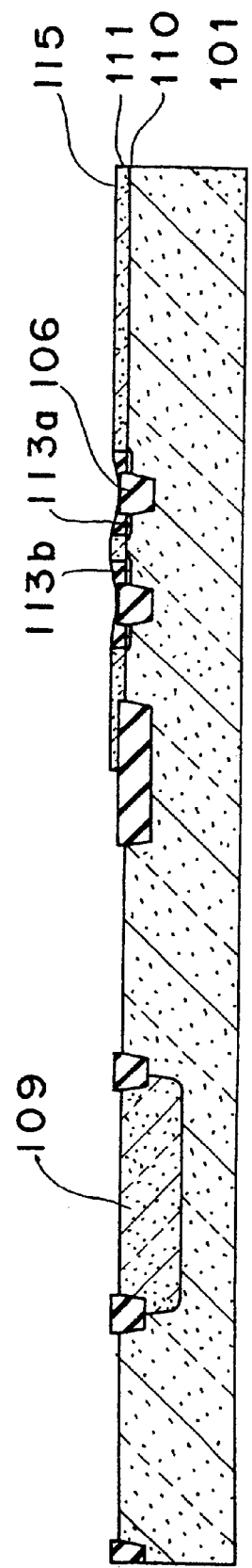
FIG. 35 is a sectional view for illustrating the conventional method of manufacturing a semiconductor device, in which the three-layer insulating film, the phosphorus-ions-doped polycrystalline silicon and the silicon oxide film are partly removed.
Figure 36:
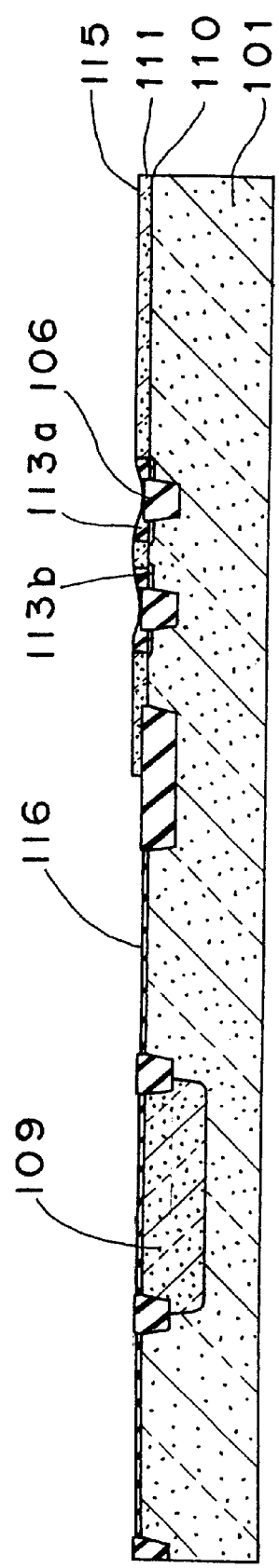
FIG. 36 is a sectional view for illustrating the conventional method of manufacturing a semiconductor device, in which a gate oxide film is grown by thermal oxidation.
Figure 37:
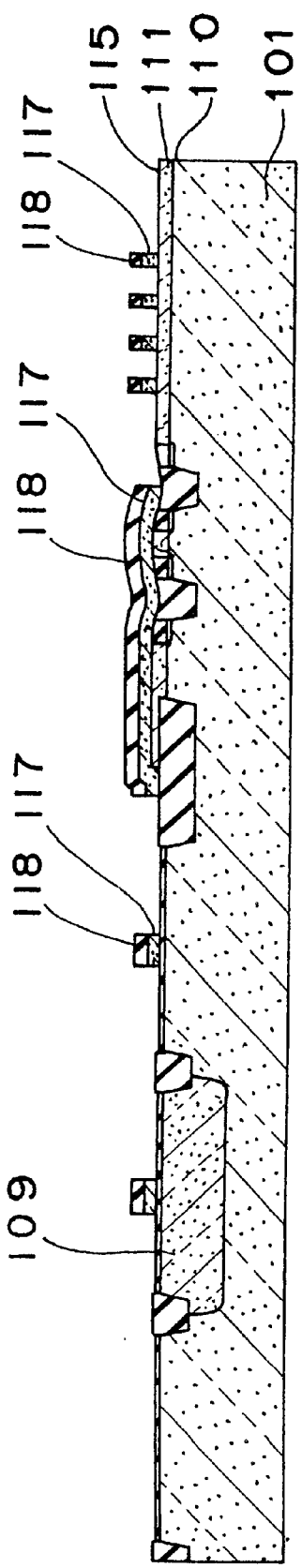
FIG. 37 is a sectional view for illustrating the conventional method of manufacturing a semiconductor device, in which phosphorus-ions-doped polycrystalline silicon and a silicon oxide film are formed in sequence and then patterned.
Figure 38:
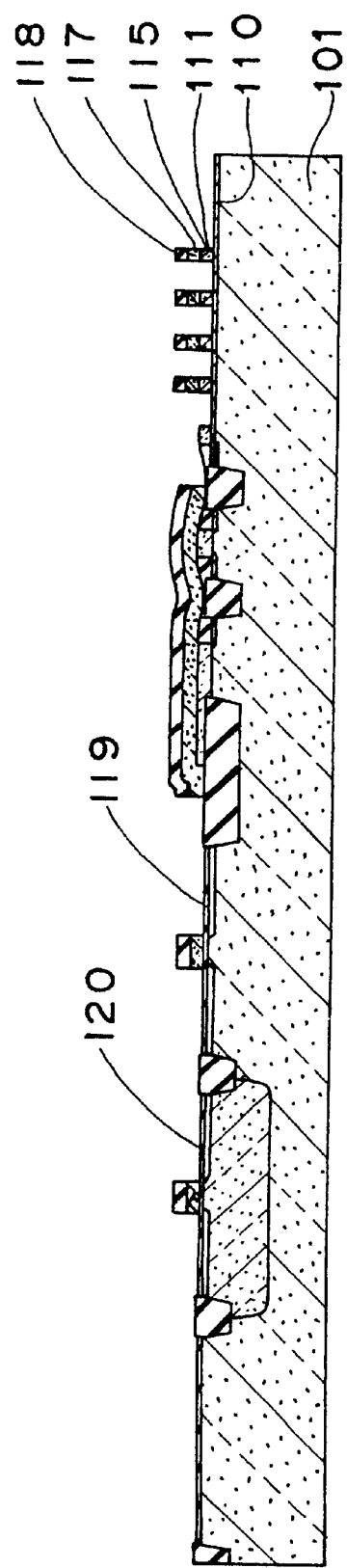
FIG. 38 is a sectional view for illustrating the conventional method of manufacturing a semiconductor device, in which a floating gate electrode of a memory transistor is formed and then an n type diffused layer and a p type diffused layer of a peripheral circuit are formed.
Figure 39:
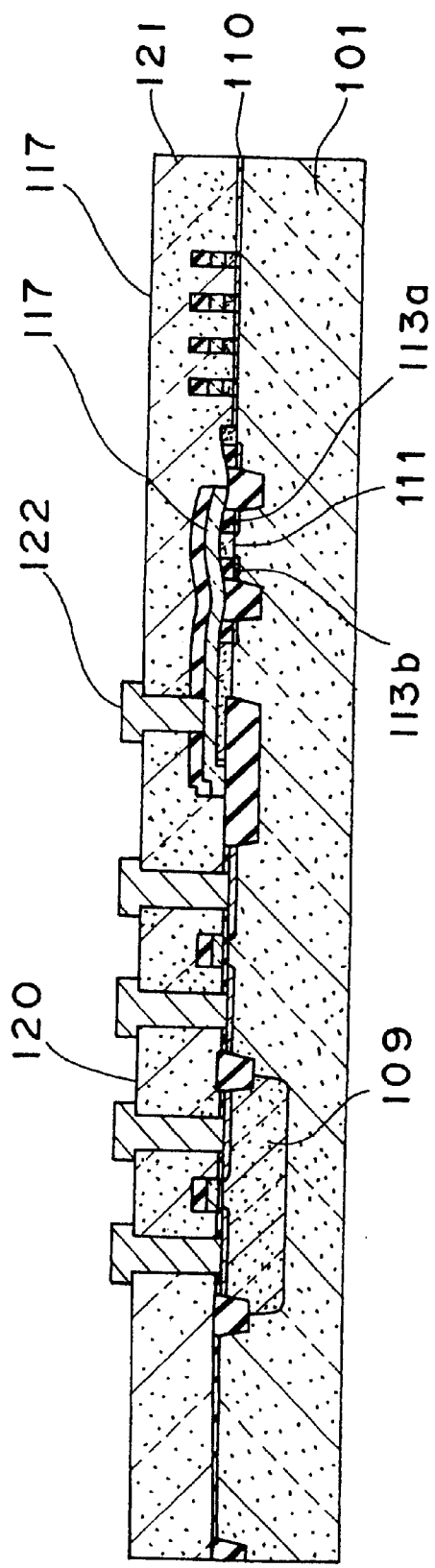
FIG. 39 is a sectional view for illustrating the conventional method of manufacturing a semiconductor device, in which boron phosphorus glass is deposited, and then an aluminum-silicon-copper alloy film is deposited by sputtering so that wiring is formed.
Figure 40:
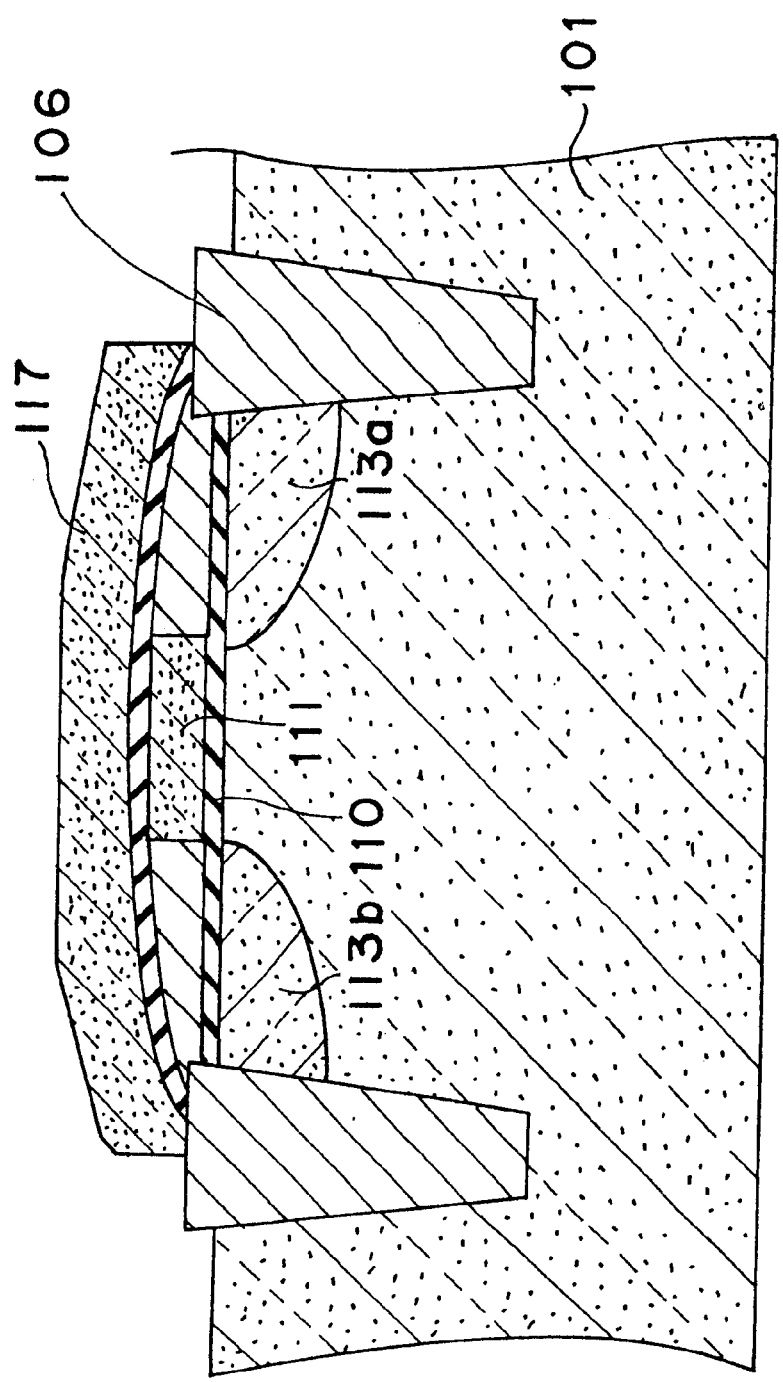
FIG. 40 is an enlarged sectional view of a memory cell of the semiconductor device shown in FIG. 24.

Subsequently, the silicon oxide film 102 and the silicon substrate 101 are etched by using the resist 104 and the silicon nitride film 103 as a mask. Etching starts at the end of the forward-tapered silicon oxide film 102 and takes place in the depth direction of the silicon substrate 101, whereby the trenches 105 each having a depth of about 400 nm are formed. After that, the resist 104 is removed (see FIG. 21). In the step of forming the trench, since the silicon nitride film 103 and the silicon oxide film 102 have a forward-tapered shape, a portion of the silicon oxide film 102 not coated with a tapered portion of the silicon nitride film 103 is etched and subsequently the silicon substrate 101 is also etched. Thus, as shown in an enlarged sectional view of FIG. 23, the forward-tapered silicon oxide film 102 before forming the trench is etched so that a surface C-D is changed into a surface C-F, and the silicon substrate 101 under the silicon oxide film 102 is also etched so that an inclined surface F-E of the edge is formed. Therefore, the edge between the surface of the silicon substrate 101 and the inner wall surface of the trench 105 can form the inclined surface to the surface of the silicon substrate 101.

Furthermore, a silicon oxide film is deposited by using HDP-CVD, whereby the trenches 105 can be filled with the deposited silicon oxide film 106 of 600 nm thick.

Then, the surface of the thick silicon oxide film 106 is polished by chemical mechanical polishing (CMP), and a predetermined amount of the silicon oxide film 106 is etched by using a hydrogen fluoride (HF) aqueous solution. Subsequently, the silicon nitride film 103 is removed by using thermal phosphoric acid, and then the silicon oxide film 102 is removed by the hydrogen fluoride aqueous solution, whereby the trench isolations 107 are formed.

After that, the semiconductor device having the trench isolation structure can be obtained through the same steps as the steps of the method of manufacturing a semiconductor device according to the first preferred embodiment.

Third Preferred Embodiment

A method of manufacturing a semiconductor device according to a third preferred embodiment is identical with the method of manufacturing a semiconductor device according to the second preferred embodiment until the step of forward tapering the silicon nitride film 103 and the silicon oxide film 102. After the step of forward tapering, the methods according to the second and third preferred embodiments differ in that the method according to the third preferred embodiment includes the step of removing the resist 104, first applying anisotropic etching to the silicon oxide film 102, and then etching the silicon substrate 101.

The method of manufacturing a semiconductor device according to the third preferred embodiment will be described. First, the silicon oxide film 102 of 10 nm thick is grown on the main surface of the p type (001) silicon substrate 101 by use of thermal oxidation. Subsequently, the silicon nitride film 103 of 200 nm thick is deposited on the silicon oxide film 102 by reduced pressure CVD method. Then, the resist 104 is formed into a desired pattern by photolithography, and then the silicon nitride film 103 and the silicon oxide film 102 are etched by using the resist 104 as a mask. At the time of etching, conditions for intensive sidewall deposition are selected by controlling a flow rate of a deposition gas, i.e., a fluorocarbon gas such as trifluoromethyl ($CHF_3$). Sidewall deposition takes place intensively, whereby etching takes place more intensively in the depth direction. Therefore, the silicon nitride film 103 and the silicon oxide film 102 can be forward tapered. After that, the resist 104 is removed.

Next, the silicon oxide film 102 is first selectively subjected to anisotropic etching by using the silicon nitride film 103 as a mask. Because of the forward-tapered shape, the silicon oxide film 102 not coated with the silicon nitride film 103 is etched, and then the silicon substrate 101 is etched. At this time, etching starts at the end of the silicon oxide film 102 and takes place in the depth direction of the silicon substrate 101, whereby the trenches 105 each having a depth of about 400 nm are formed. Since the silicon nitride film 103 and the silicon oxide film 102 have the forward-tapered shape, a tapered portion of the silicon oxide film 102 not coated with a tapered portion of the silicon nitride film 103 is etched and subsequently the silicon substrate 101 is also etched. Therefore, the edge between the inner wall surface of the trench 105 and the surface of the silicon substrate 101 can form the inclined surface to the surface of the silicon substrate 101.

Furthermore, a silicon oxide film is deposited by using HDP-CVD, whereby the trenches 105 can be filled with the deposited silicon oxide film 106 of 600 nm thick.

Then, the surface of the thick silicon oxide film 106 is polished by chemical mechanical polishing (CMP), and a predetermined amount of the silicon oxide film 106 is etched by using a hydrogen fluoride (HF) aqueous solution. Subsequently, the silicon nitride film 103 is removed by using thermal phosphoric acid, and then the silicon oxide film 102 is removed by the hydrogen fluoride aqueous solution, whereby the trench isolations 107 are formed.

After that, the semiconductor device having the trench isolation structure can be obtained through the same steps as the steps of the method of manufacturing a semiconductor device according to the first preferred embodiment.

What is claimed is:

1. A method of manufacturing a semiconductor device having a trench isolation structure, comprising the steps of:

patterning a mask film on a semiconductor substrate;

forming a trench by etching said semiconductor substrate by use of said mask film;

filling said trench with an insulating film by repeating the step of depositing the insulating film in said trench and the step of etching the insulating film by sputter etching;

removing said mask film; and removing said insulating film by etching a predetermined amount of said insulating film filled in said trench, wherein, by said sputter etching in the step of filling said trench with the insulating film, an edge between a surface of said substrate and an inner wall surface of said trench forms an inclined surface to the surface of said substrate.

2. The method of manufacturing a semiconductor device having a trench isolation structure according to claim 1, wherein said sputter etching includes controlling a flow rate of a flowing deposition gas.

3. The method of manufacturing a semiconductor device having a trench isolation structure according to claim 1, wherein said mask film comprises a silicon oxide film and a silicon nitride film formed on said silicon oxide film.

4. The method of manufacturing a semiconductor device having a trench isolation structure according to claim 1, wherein said insulating film filing in said trench is a silicon oxide film.

5. The method of manufacturing a nonvolatile semiconductor memory according to claim 1, wherein said semiconductor device having said trench isolation structure is a nonvolatile semiconductor memory.

* * * * *